(12) United States Patent
Yamagishi et al.

(10) Patent No.: US 8,078,936 B2
(45) Date of Patent: Dec. 13, 2011

(54) ENCODING METHOD, ENCODING APPARATUS, AND PROGRAM

(75) Inventors: Hiroyuki Yamagishi, Tokyo (JP); Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 924 days.

(21) Appl. No.: 12/061,423

(22) Filed: Apr. 2, 2008

(65) Prior Publication Data

US 2008/0250295 A1    Oct. 9, 2008

(30) Foreign Application Priority Data

Apr. 6, 2007    (JP) .................. 2007-100883

(51) Int. Cl.
*G06F 11/00*    (2006.01)

(52) U.S. Cl. ...................... 714/755; 714/759

(58) Field of Classification Search .................. 714/758, 714/755, 757, 759, 766, 767, 791, 800, 801
See application file for complete search history.

(56) References Cited

U.S. PATENT DOCUMENTS

| 4,453,249 | A | 6/1984 | Roth et al. | |
|---|---|---|---|---|
| 2005/0149845 | A1 | 7/2005 | Shin et al. | |
| 2005/0204261 | A1* | 9/2005 | Kan et al. ................. | 714/755 |
| 2008/0250295 | A1* | 10/2008 | Yamagishi et al. ........ | 714/757 |
| 2010/0169736 | A1* | 7/2010 | Garani ..................... | 714/752 |
| 2011/0154168 | A1* | 6/2011 | Lee et al. ................. | 714/801 |

OTHER PUBLICATIONS

Chen, Liang et al., "Implementation of Multi-Rate Quasi-Cyclic Low-Density Parity-Check Codes," Proc. of the 9th Intern. Conference on Advanced Communication Technology, pp. 1066-1070, Feb. 1, 2007, XP 031084956, ISBN: 978-89-5519-131-8.

Fujita, Hachiro et al., "Some Classes of Quasi-Cyclic LDPC Codes: Properties and Efficient Encoding Method," IEICE Trans. Fundamentals, vol. E88-A, pp. 3627-3635, Dec. 12, 2005, XP-001238282.

Li, Zongwang et al., "Efficient Encoding of Quasi-Cyclic Low-Density Parity-Check Codes," IEEE Transactions on Communications, vol. 54, pp. 71-81, Jan. 1, 2006, XP-002489550.

Tanner, Michael R. et al., "LDPC Block and Convolutional Codes Based on Circulant Matrices," IEEE Transactions on Information Theory, vol. 50, p. 2966-2984, Dec. 12, 2004, XP-011122837.

Townsend, Richard L. et al., "Self-Orthogonal Quasi-Cyclic Codes," IEEE Transactions on Information Theory, vol. IT-13, pp. 183-195, Apr. 2007, XP-002489558.

(Continued)

*Primary Examiner* — Dieu-Minh Le
(74) *Attorney, Agent, or Firm* — K&L Gates LLP

(57) ABSTRACT

An encoding method encodes by using a quasi-cyclic code having a code length of $n=m \, n_0$ and an information word length of $k=m \, k_0$. The method includes the steps of: creating a systematic code with as many as $(n_0-k_0)$ parity bits inserted therein in units of an information word $k_0$; making all combinations of $(n_0-k_0)$ parity bit positions that may occur in units of $n_0$ bits; describing many of m×m cyclic matrices by rearranging the sequence of columns in a parity check matrix in the combinations; subjecting the parity check matrix to elementary transformation to create a unit matrix in which $(n-k)\times(n-k)$ matrices made up of the columns corresponding to the parity bit positions; regarding the transformed matrix as a first matrix and this matrix minus the unit matrix as a second matrix; and allocating $(n-k)$ bit positions for the parity bits in such a manner that the number of non-zero elements included in the second matrix is minimized.

15 Claims, 19 Drawing Sheets

OTHER PUBLICATIONS

Yoon, Chanho et al., "Arbitrary Bit Generation and Correction Technique for Encoding QC-LDPC Codes with Dual-Diagonal Parity Structure," Wireless Communications and Networking Conference, 2007 . WCNC 2007, IEEE, pp. 663-667, XP031088612.

Kou et al., "Low-Density Parity-Check Codes Based on Finite Geometries: A Rediscovery and New Results," IEEE Transactions on Information Theory, vol. 47, pp. 2711-2736, 2001.

Townsend et al., "Self-Orthogonal Quasi-Cyclic Codes," IEEE Transactions on Information Theory, vol. IT-13, 1967.

Luby et al., "Analysis of Low Density Codes and Improved Designs Using Irregular Graphs," Proceedings of ACM Symposium on Theory of Computing, pp. 249-258, 1998.

Gallager, R. G., "Low-Density Parity-Check Codes," IRE Transactions on Information Theory, pp. 21-28. 1962.

MacKay, D. J. C., "Good Error-Correcting Codes Based on Very Sparse Matrices," IEEE Transactions on Information Theory, vol. 45, pp. 399-431, 1999.

\* cited by examiner

FIG.3

$$H = \begin{pmatrix} 1 & 1 & 1 & 0 & 0 & 1 & 0 & 0 & 1 & 0 & 0 & 0 & 0 & 0 & 0 & 1 & 0 & 0 & 0 & 0 & 0 & 0 & 0 & 0 & 0 & 0 \\ 0 & 0 & 1 & 1 & 1 & 0 & 0 & 1 & 0 & 0 & 1 & 0 & 0 & 0 & 0 & 0 & 1 & 0 & 0 & 0 & 0 & 0 & 0 & 0 & 0 & 0 \\ 0 & 0 & 0 & 0 & 1 & 1 & 1 & 0 & 0 & 1 & 0 & 0 & 1 & 0 & 0 & 0 & 0 & 0 & 1 & 0 & 0 & 0 & 0 & 0 & 0 & 0 \\ 0 & 0 & 0 & 0 & 0 & 0 & 1 & 1 & 1 & 0 & 0 & 1 & 0 & 0 & 1 & 0 & 0 & 0 & 0 & 0 & 0 & 1 & 0 & 0 & 0 & 0 \\ 0 & 0 & 0 & 0 & 0 & 0 & 0 & 0 & 1 & 1 & 1 & 0 & 0 & 1 & 0 & 0 & 1 & 0 & 0 & 0 & 0 & 0 & 0 & 1 & 0 & 0 \\ 0 & 0 & 0 & 0 & 0 & 0 & 0 & 0 & 0 & 0 & 1 & 1 & 1 & 0 & 0 & 1 & 0 & 0 & 1 & 0 & 0 & 0 & 0 & 0 & 0 & 1 \\ 0 & 1 & 0 & 0 & 0 & 0 & 0 & 0 & 0 & 0 & 0 & 1 & 1 & 1 & 0 & 0 & 1 & 0 & 0 & 1 & 0 & 0 & 0 & 0 & 0 & 0 \\ 0 & 0 & 0 & 1 & 0 & 0 & 0 & 0 & 0 & 0 & 0 & 0 & 0 & 1 & 1 & 1 & 0 & 0 & 1 & 0 & 0 & 1 & 0 & 0 & 0 & 0 \\ 0 & 0 & 0 & 0 & 0 & 1 & 0 & 0 & 0 & 0 & 0 & 0 & 0 & 0 & 0 & 1 & 1 & 1 & 0 & 0 & 1 & 0 & 0 & 1 & 0 & 0 \\ 1 & 0 & 0 & 0 & 0 & 0 & 0 & 1 & 0 & 0 & 0 & 0 & 0 & 0 & 0 & 0 & 0 & 1 & 1 & 1 & 0 & 0 & 1 & 0 & 0 & 0 \\ 0 & 0 & 1 & 0 & 0 & 0 & 0 & 0 & 0 & 1 & 0 & 0 & 0 & 0 & 0 & 0 & 0 & 0 & 0 & 1 & 1 & 1 & 0 & 0 & 0 & 1 \\ 0 & 1 & 0 & 0 & 1 & 0 & 0 & 0 & 0 & 0 & 0 & 1 & 0 & 0 & 0 & 0 & 0 & 0 & 0 & 0 & 0 & 1 & 1 & 1 & 0 \\ 1 & 0 & 0 & 1 & 0 & 0 & 1 & 0 & 0 & 0 & 0 & 0 & 0 & 1 & 0 & 0 & 0 & 0 & 0 & 0 & 0 & 0 & 0 & 1 & 1 \end{pmatrix}$$

FIG.4

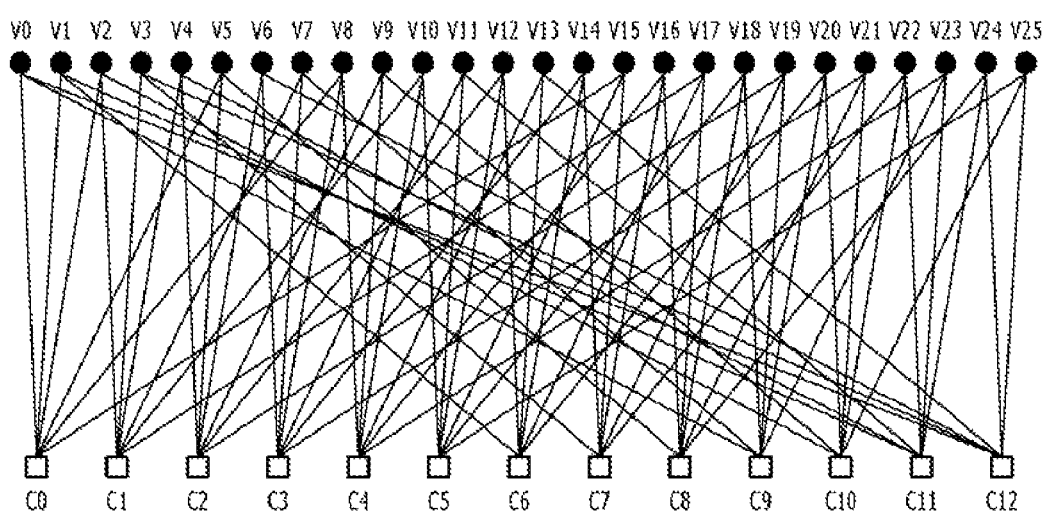

FIG. 5

$$H' = \begin{pmatrix}
1 & 1 & 0 & 0 & 1 & 0 & 0 & 0 & 0 & 0 & 0 & 0 & 1 & 0 & 1 & 0 & 0 & 0 & 0 & 1 & 0 & 0 & 0 & 0 & 0 \\
0 & 1 & 1 & 0 & 0 & 1 & 0 & 0 & 0 & 0 & 0 & 0 & 0 & 1 & 0 & 1 & 0 & 0 & 0 & 0 & 1 & 0 & 0 & 0 & 0 \\
0 & 0 & 1 & 1 & 0 & 0 & 1 & 0 & 0 & 0 & 0 & 0 & 0 & 0 & 1 & 0 & 1 & 0 & 0 & 0 & 0 & 1 & 0 & 0 & 0 \\
0 & 0 & 0 & 1 & 1 & 0 & 0 & 1 & 0 & 0 & 0 & 0 & 0 & 0 & 0 & 1 & 0 & 1 & 0 & 0 & 0 & 0 & 1 & 0 & 0 \\
0 & 0 & 0 & 0 & 1 & 1 & 0 & 0 & 1 & 0 & 0 & 0 & 0 & 0 & 0 & 0 & 1 & 0 & 1 & 0 & 0 & 0 & 0 & 1 & 0 \\
0 & 0 & 0 & 0 & 0 & 1 & 1 & 0 & 0 & 1 & 0 & 0 & 0 & 0 & 0 & 0 & 0 & 1 & 0 & 1 & 0 & 0 & 0 & 0 & 1 \\
0 & 0 & 0 & 0 & 0 & 0 & 1 & 1 & 0 & 0 & 1 & 0 & 0 & 1 & 0 & 0 & 0 & 0 & 0 & 1 & 0 & 1 & 0 & 0 & 0 & 0 \\
0 & 0 & 0 & 0 & 0 & 0 & 0 & 1 & 1 & 0 & 0 & 1 & 0 & 0 & 1 & 0 & 0 & 0 & 0 & 0 & 0 & 1 & 0 & 1 & 0 & 0 & 0 \\
0 & 0 & 0 & 0 & 0 & 0 & 0 & 0 & 1 & 1 & 0 & 0 & 1 & 0 & 0 & 1 & 0 & 0 & 0 & 0 & 0 & 0 & 1 & 0 & 1 & 0 & 0 \\
1 & 0 & 0 & 0 & 0 & 0 & 0 & 0 & 0 & 1 & 1 & 0 & 0 & 0 & 0 & 0 & 1 & 0 & 0 & 0 & 0 & 0 & 1 & 0 & 1 & 0 \\
0 & 1 & 0 & 0 & 0 & 0 & 0 & 0 & 0 & 0 & 1 & 1 & 0 & 0 & 0 & 0 & 0 & 1 & 0 & 0 & 0 & 0 & 0 & 1 & 0 & 1 \\
0 & 0 & 1 & 0 & 0 & 0 & 0 & 0 & 0 & 0 & 0 & 1 & 1 & 1 & 0 & 0 & 0 & 0 & 1 & 0 & 0 & 0 & 0 & 0 & 1 & 0 \\
1 & 0 & 0 & 1 & 0 & 0 & 0 & 0 & 0 & 0 & 0 & 0 & 1 & 0 & 1 & 0 & 0 & 0 & 1 & 0 & 0 & 0 & 0 & 0 & 1
\end{pmatrix}$$

FIG. 6

$$H' = \begin{pmatrix}
H_{0,0} & H_{0,1} & \cdots & H_{0,n_0-1} \\
H_{1,0} & H_{1,1} & \cdots & H_{1,n_0-1} \\
\vdots & \vdots & \ddots & \vdots \\
H_{q-1,0} & H_{q-1,1} & \cdots & H_{q-1,n_0-1}
\end{pmatrix}$$

FIG. 7

$$H = \begin{pmatrix}
1 & 1 & 1 & 1 & 0 & 0 & 0 & 1 & 0 & 0 & 0 & 0 & 1 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 \\
0 & 0 & 0 & 1 & 1 & 1 & 1 & 0 & 0 & 0 & 1 & 0 & 0 & 0 & 0 & 1 & 0 & 0 & 0 & 0 & 0 & 0 & 0 & 0 & 1 & 0 & 0 & 0 & 0 & 0 & 0 & 0 & 0 & 0 & 0 & 0 \\
0 & 0 & 0 & 0 & 0 & 0 & 1 & 1 & 1 & 1 & 0 & 0 & 0 & 1 & 0 & 0 & 0 & 1 & 0 & 0 & 0 & 0 & 0 & 0 & 0 & 0 & 0 & 1 & 0 & 0 & 0 & 0 & 0 & 0 & 0 & 0 \\
0 & 0 & 0 & 0 & 0 & 0 & 0 & 0 & 0 & 1 & 1 & 1 & 1 & 0 & 0 & 1 & 0 & 0 & 0 & 1 & 0 & 0 & 0 & 0 & 0 & 0 & 0 & 0 & 0 & 1 & 0 & 0 & 0 & 0 & 0 & 0 \\
0 & 0 & 0 & 0 & 0 & 0 & 0 & 0 & 0 & 0 & 0 & 0 & 1 & 1 & 1 & 1 & 0 & 0 & 1 & 0 & 0 & 0 & 1 & 0 & 0 & 0 & 0 & 0 & 0 & 0 & 0 & 1 & 0 & 0 & 0 & 0 \\
0 & 0 & 0 & 0 & 0 & 0 & 0 & 0 & 0 & 0 & 0 & 0 & 0 & 0 & 0 & 1 & 1 & 1 & 1 & 0 & 0 & 1 & 0 & 0 & 0 & 1 & 0 & 0 & 0 & 0 & 0 & 0 & 0 & 1 & 0 & 0 \\
0 & 1 & 0 & 0 & 0 & 0 & 0 & 0 & 0 & 0 & 0 & 0 & 0 & 0 & 0 & 0 & 0 & 1 & 1 & 1 & 1 & 0 & 0 & 1 & 0 & 0 & 0 & 1 & 0 & 0 & 0 & 0 & 0 & 0 & 0 & 0 \\
0 & 0 & 0 & 0 & 1 & 0 & 0 & 0 & 0 & 0 & 0 & 0 & 0 & 0 & 0 & 0 & 0 & 0 & 0 & 0 & 1 & 1 & 1 & 1 & 0 & 0 & 1 & 0 & 0 & 0 & 1 & 0 & 0 & 0 & 0 & 0 \\
0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 1 & 1 & 1 & 1 & 0 & 0 & 1 & 0 & 0 & 0 & 1 & 0 & 0 \\
0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 1 & 1 & 1 & 1 & 0 & 0 & 1 & 0 & 0 & 1 & 0 \\
1 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 1 & 1 & 1 & 1 & 0 & 0 & 1 & 0 & 0 & 0 \\
0 & 0 & 0 & 1 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 1 & 1 & 1 & 1 & 0 & 0 & 1 & 0 \\
0 & 1 & 0 & 0 & 0 & 0 & 1 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 1 & 1 & 1 & 1 & 0 & 0 \\
1 & 0 & 0 & 0 & 1 & 0 & 0 & 0 & 1 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 1 & 1 & 1
\end{pmatrix}$$

FIG.8

$$H' = \begin{pmatrix} 1 & 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 0 & 1 & 0 & 0 & 0 & 0 & 0 & 0 & 0 & 0 & 0 & 0 & 0 & 0 & 0 \\ 0 & 1 & 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 0 & 1 & 0 & 0 & 0 & 0 & 0 & 0 & 0 & 0 & 0 & 0 & 0 & 0 \\ 0 & 0 & 1 & 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 0 & 1 & 0 & 0 & 0 & 0 & 0 & 0 & 0 & 0 & 0 & 0 & 0 \\ 0 & 0 & 0 & 1 & 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 0 & 1 & 0 & 0 & 0 & 0 & 0 & 0 & 0 & 0 & 0 & 0 \\ 0 & 0 & 0 & 0 & 1 & 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 0 & 1 & 0 & 0 & 0 & 0 & 0 & 0 & 0 & 0 & 0 \\ 0 & 0 & 0 & 0 & 0 & 1 & 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 0 & 1 & 0 & 0 & 0 & 0 & 0 & 0 & 0 & 0 \\ 0 & 0 & 0 & 0 & 0 & 0 & 1 & 1 & 0 & 0 & 1 & 0 & 0 & 0 & 1 & 0 & 0 & 0 & 0 & 0 & 1 & 0 & 1 & 0 & 0 & 0 & 0 & 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 1 & 1 & 0 & 0 & 1 & 0 & 0 & 0 & 1 & 0 & 0 & 0 & 0 & 0 & 1 & 0 & 1 & 0 & 0 & 0 & 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 1 & 1 & 0 & 0 & 1 & 0 & 0 & 1 & 0 & 0 & 0 & 0 & 0 & 0 & 1 & 0 & 1 & 0 & 0 & 0 & 0 & 0 & 0 & 0 & 0 & 0 & 0 & 0 & 1 & 0 & 0 & 0 & 0 & 0 \\ 1 & 0 & 0 & 0 & 0 & 0 & 0 & 0 & 0 & 1 & 1 & 0 & 0 & 0 & 0 & 0 & 1 & 0 & 0 & 0 & 0 & 0 & 0 & 1 & 0 & 1 & 0 & 0 & 0 & 0 & 0 & 0 & 0 & 0 & 0 & 0 & 0 & 1 & 0 & 0 & 0 & 0 \\ 0 & 1 & 0 & 0 & 0 & 0 & 0 & 0 & 0 & 0 & 1 & 1 & 0 & 0 & 0 & 0 & 0 & 1 & 0 & 0 & 0 & 0 & 0 & 0 & 1 & 0 & 1 & 0 & 0 & 0 & 0 & 0 & 0 & 0 & 0 & 0 & 0 & 0 & 1 & 0 & 0 & 0 \\ 0 & 0 & 1 & 0 & 0 & 0 & 0 & 0 & 0 & 0 & 0 & 1 & 1 & 0 & 1 & 0 & 0 & 0 & 0 & 1 & 0 & 0 & 0 & 0 & 0 & 1 & 0 & 1 & 0 & 0 & 0 & 0 & 0 & 0 & 0 & 0 & 0 & 0 & 0 & 1 & 0 & 0 \\ 1 & 0 & 0 & 1 & 0 & 0 & 0 & 0 & 0 & 0 & 0 & 0 & 0 & 1 & 0 & 1 & 0 & 0 & 0 & 0 & 1 & 0 & 0 & 0 & 0 & 0 & 1 & 0 & 0 & 0 & 0 & 0 & 0 & 0 & 0 & 0 & 0 & 0 & 0 & 0 & 0 & 1 \end{pmatrix}$$

FIG.13A

FIG.13B

FIG.14

$$H''=\begin{pmatrix} 1 & 0 & 0 & 0 & 0 & 0 & 0 & 0 & 0 & 0 & 0 & 0 & 1 & 0 & 0 & 0 & 1 & 1 & 1 & 0 & 1 & 0 & 1 & 1 & 0 \\ 0 & 1 & 0 & 0 & 0 & 0 & 0 & 0 & 0 & 0 & 0 & 0 & 0 & 1 & 0 & 0 & 0 & 1 & 1 & 1 & 0 & 1 & 0 & 1 & 1 \\ 0 & 0 & 1 & 0 & 0 & 0 & 0 & 0 & 0 & 0 & 0 & 0 & 1 & 0 & 1 & 0 & 0 & 0 & 1 & 1 & 1 & 0 & 1 & 0 & 1 \\ 0 & 0 & 0 & 1 & 0 & 0 & 0 & 0 & 0 & 0 & 0 & 0 & 1 & 1 & 0 & 1 & 0 & 0 & 0 & 1 & 1 & 1 & 0 & 1 & 0 \\ 0 & 0 & 0 & 0 & 1 & 0 & 0 & 0 & 0 & 0 & 0 & 0 & 0 & 1 & 1 & 0 & 1 & 0 & 0 & 0 & 1 & 1 & 1 & 0 & 1 \\ 0 & 0 & 0 & 0 & 0 & 1 & 0 & 0 & 0 & 0 & 0 & 0 & 1 & 0 & 1 & 1 & 0 & 1 & 0 & 0 & 0 & 1 & 1 & 1 & 0 \\ 0 & 0 & 0 & 0 & 0 & 0 & 1 & 0 & 0 & 0 & 0 & 0 & 0 & 1 & 0 & 1 & 1 & 0 & 1 & 0 & 0 & 0 & 1 & 1 & 1 \\ 0 & 0 & 0 & 0 & 0 & 0 & 0 & 1 & 0 & 0 & 0 & 0 & 1 & 0 & 1 & 0 & 1 & 1 & 0 & 1 & 0 & 0 & 0 & 1 & 1 \\ 0 & 0 & 0 & 0 & 0 & 0 & 0 & 0 & 1 & 0 & 0 & 0 & 1 & 1 & 0 & 1 & 0 & 1 & 1 & 0 & 1 & 0 & 0 & 0 & 1 \\ 0 & 0 & 0 & 0 & 0 & 0 & 0 & 0 & 0 & 1 & 0 & 0 & 1 & 1 & 1 & 0 & 1 & 0 & 1 & 1 & 0 & 1 & 0 & 0 & 0 \\ 0 & 0 & 0 & 0 & 0 & 0 & 0 & 0 & 0 & 0 & 1 & 0 & 0 & 1 & 1 & 1 & 0 & 1 & 0 & 1 & 1 & 0 & 1 & 0 & 0 \\ 0 & 0 & 0 & 0 & 0 & 0 & 0 & 0 & 0 & 0 & 0 & 1 & 0 & 0 & 1 & 1 & 1 & 0 & 1 & 0 & 1 & 1 & 0 & 1 & 0 \\ 0 & 0 & 0 & 0 & 0 & 0 & 0 & 0 & 0 & 0 & 0 & 0 & 1 & 0 & 0 & 0 & 1 & 1 & 1 & 0 & 1 & 0 & 1 & 1 & 0 & 1 \end{pmatrix}$$

FIG.15

$$H'' = \begin{bmatrix} 1 & 0 & 1 & 0 & 0 & 0 & 1 & 0 & 0 & 0 & 0 & 0 & 1 & 0 & 0 & 0 & 0 & 0 & 0 & 0 & 0 & 0 & 0 & 0 \\ 0 & 1 & 0 & 1 & 0 & 0 & 0 & 1 & 0 & 0 & 0 & 0 & 0 & 1 & 0 & 0 & 0 & 0 & 0 & 0 & 0 & 0 & 0 & 0 \\ 0 & 0 & 1 & 0 & 1 & 0 & 0 & 0 & 1 & 0 & 0 & 0 & 0 & 0 & 1 & 0 & 0 & 0 & 0 & 0 & 0 & 0 & 0 & 0 \\ 0 & 0 & 0 & 1 & 0 & 1 & 0 & 0 & 0 & 1 & 0 & 0 & 0 & 0 & 0 & 1 & 0 & 0 & 0 & 0 & 0 & 0 & 0 & 0 \\ 0 & 0 & 0 & 0 & 1 & 0 & 1 & 0 & 0 & 0 & 1 & 0 & 0 & 0 & 0 & 0 & 1 & 0 & 0 & 0 & 0 & 0 & 0 & 0 \\ 0 & 0 & 0 & 0 & 0 & 1 & 0 & 1 & 0 & 0 & 0 & 1 & 0 & 0 & 0 & 0 & 0 & 1 & 0 & 0 & 0 & 0 & 0 & 0 \\ 1 & 0 & 0 & 0 & 0 & 0 & 1 & 0 & 1 & 0 & 0 & 0 & 0 & 0 & 0 & 0 & 0 & 0 & 1 & 0 & 0 & 0 & 0 & 0 \\ 0 & 1 & 0 & 0 & 0 & 0 & 0 & 1 & 0 & 1 & 0 & 0 & 0 & 0 & 0 & 0 & 0 & 0 & 0 & 1 & 0 & 0 & 0 & 0 \\ 0 & 0 & 1 & 0 & 0 & 0 & 0 & 0 & 1 & 0 & 1 & 0 & 0 & 0 & 0 & 0 & 0 & 0 & 0 & 0 & 1 & 0 & 0 & 0 \\ 0 & 0 & 0 & 1 & 0 & 0 & 0 & 0 & 0 & 1 & 0 & 1 & 0 & 0 & 0 & 0 & 0 & 0 & 0 & 0 & 0 & 1 & 0 & 0 \\ 0 & 0 & 0 & 0 & 1 & 0 & 0 & 0 & 0 & 0 & 1 & 0 & 1 & 0 & 0 & 0 & 0 & 0 & 0 & 0 & 0 & 0 & 1 & 0 \\ 1 & 0 & 0 & 0 & 0 & 1 & 0 & 0 & 0 & 0 & 0 & 1 & 0 & 0 & 0 & 0 & 0 & 0 & 0 & 0 & 0 & 0 & 0 & 1 \\ 0 & 1 & 0 & 0 & 0 & 0 & 1 & 0 & 0 & 0 & 0 & 0 & 1 & 0 & 0 & 0 & 0 & 0 & 0 & 0 & 0 & 0 & 0 & 0 \end{bmatrix}$$

FIG. 18

$$H'' = (P \ I) = \begin{pmatrix} p_{0,0} & p_{0,1} & \cdots & p_{0,k_0-1} & 1 & 0 & \cdots & 0 \\ p_{1,0} & p_{1,1} & \cdots & p_{1,k_0-1} & 0 & 1 & \cdots & 0 \\ \vdots & \vdots & \ddots & \vdots & \vdots & \vdots & \ddots & \vdots \\ p_{n_0-k_0-1,0} & p_{n_0-k_0-1,1} & \cdots & p_{n_0-k_0-1,k_0-1} & 0 & 0 & \cdots & 1 \end{pmatrix}$$

FIG.21

| CYCLIC MATRIX | ROW NO. OF ROW OF WHICH ELEMENT IS 1 IN COLUMN 0 | | |
|---|---|---|---|
| $H_{0,0}$ | 111 | 136 | 147 |
| $H_{0,1}$ | 40 | 56 | 68 |
| $H_{0,2}$ | 33 | 47 | 60 |
| $H_{0,3}$ | 97 | 114 | 129 |
| $H_{0,4}$ | 83 | 102 | 120 |
| $H_{0,5}$ | 1 | 22 | 42 |
| $H_{0,6}$ | 13 | 35 | 138 |
| $H_{0,7}$ | 54 | 80 | 104 |
| $H_{0,8}$ | 31 | 62 | 91 |
| $H_{0,9}$ | 6 | 89 | 124 |
| $H_{0,10}$ | 44 | 77 | 140 |
| $H_{0,11}$ | 37 | 71 | 132 |
| $H_{0,12}$ | 20 | 58 | 117 |
| $H_{0,13}$ | 52 | 106 | 145 |
| $H_{0,14}$ | 24 | 64 | 126 |
| $H_{0,15}$ | 8 | 66 | 108 |
| $H_{0,16}$ | 29 | 85 | 134 |
| $H_{0,17}$ | 3 | 50 | 94 |

FIG.22

| CYCLIC MATRIX | ROW NO. OF ROW OF WHICH ELEMENT IS 1 IN COLUMN 0 | | |
|---|---|---|---|
| $H_{0,0}$ | 0 | 9 | 12 |
| $H_{0,1}$ | 0 | 6 | 11 |

FIG.23

| CYCLIC MATRICES CORRESPONDING TO POSITIONS REGARDED AS PARITY CANDIDATES | SUM OF w | MAXIMUM OF w |
|---|---|---|
| $H_{0,0}$ | 1263 | 13 |
| $H_{0,1}$ | 653 | 9 |
| $H_{0,2}$ | 1287 | 13 |
| $H_{0,3}$ | 1297 | 15 |
| $H_{0,4}$ | 427 | 6 |
| $H_{0,5}$ | 1239 | 15 |
| $H_{0,6}$ | 1229 | 13 |
| $H_{0,7}$ | 1177 | 12 |
| $H_{0,8}$ | 1207 | 13 |
| $H_{0,9}$ | 1263 | 14 |
| $H_{0,10}$ | 1249 | 14 |
| $H_{0,11}$ | 1241 | 14 |
| $H_{0,12}$ | 1271 | 14 |
| $H_{0,13}$ | 1295 | 15 |
| $H_{0,14}$ | 1207 | 14 |
| $H_{0,15}$ | 1267 | 15 |
| $H_{0,16}$ | 1253 | 13 |
| $H_{0,17}$ | 1303 | 16 |

FIG.24

| CYCLIC MATRICES CORRESPONDING TO POSITIONS REGARDED AS PARITY CANDIDATES | SUM OF w | MAXIMUM OF w |
|---|---|---|
| $H_{0,0}$ | 7 | 1 |
| $H_{0,1}$ | 3 | 1 |

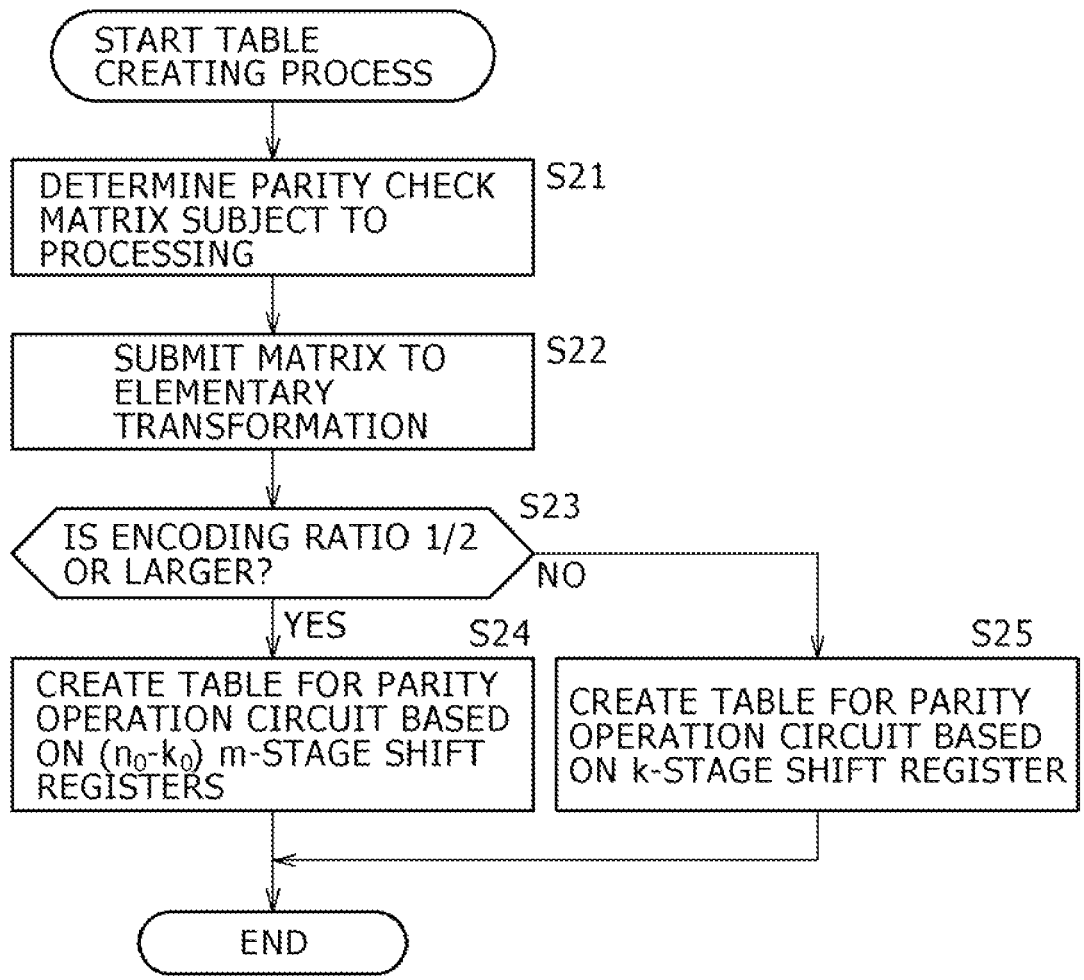

US 8,078,936 B2

ENCODING METHOD, ENCODING APPARATUS, AND PROGRAM

CROSS REFERENCES TO RELATED APPLICATIONS

The present application claims priority to Japanese Patent Application JP 2007-100883 filed with the Japanese Patent Office on Apr. 6, 2007, the entire contents of which being incorporated herein by reference.

BACKGROUND

The present application relates to an encoding method, an encoding apparatus, and a program. More particularly, the present application relates to an encoding method, an encoding apparatus, and a program for reducing the size of encoding circuitry while minimizing the amount of operations involved.

In recent years, considerable progress has been made in studies on the field of communication such as mobile communication systems and on the field of broadcasting covering terrestrial and satellite digital broadcasts. That trend has entailed extensive studies on coding theory aimed at improving efficiency in encoding and decoding with error-correcting arrangements.

As the theoretical limit to code performance, the so-called Shannon limit determined by C. E. Shannon's channel coding theorem is well known. Today's studies on coding theory are centered on developing codes with their performance coming close to the Shannon limit. Recently, so-called turbo coding techniques have been developed as codes with their performance approaching the Shannon limit. The turbo coding techniques illustratively include PCCC (Parallel Concatenated Convolutional Codes) and SCCC (Serially Concatenated Convolutional Codes). Apart from these turbo coding techniques, the long-known coding techniques called the Low Density Parity Check Codes (referred to as the LDPC code or codes hereunder) have also come into the limelight.

The LDPC codes were first proposed by R. G. Gallager in "Low Density Parity Check Codes" (by R. G. Gallager, Cambridge, Mass.; M.I.T. Press, 1963). Later, the LDPC codes were highlighted again in particular by D. J. C. MacKay in "Good error correcting codes based on very sparse matrices" (submitted to IEEE Trans. Inf. Theory, IT-45, pp. 399-431, 1999) and by M. G. Luby, M. Mitzenmacher, M. A. Shokrollahi and D. A. Spielman in "Analysis of low density codes and improved designs using irregular graphs" (Proceedings of ACM Symposium on Theory of Computing, pp. 249-258, 1998).

Recent studies have suggested that the LDPC codes, like turbo coding, are capable of approaching the Shannon limit in performance when their code length is increased progressively. Because their minimum distance is proportional to their code length, the LDPC codes provide an excellent block error rate. Another benefit of the LDPC codes is that they manifest few signs of the so-called error floor phenomenon observed with turbo coding and other techniques during decoding.

The following four documents are cited as relevant to the present application:
Y. Kou, S. Lin, M. P. C. Fossorier, "Low-Density Parity-Check Codes Based on Finite Geometries: A Rediscovery and New Results," IEEE Transactions on Information Theory, Vol. 47, No. 7, pp. 2711-2736, November 2001 (called Non-patent document 1 hereunder).
R. L. Townsend, E. J. Weldon, "Self-Orthogonal Quasi-Cyclic Codes," IEEE Transactions on Information Theory, Vol. IT-13, No. 2, April 1967 (called Non-patent document 2).
Dieter Roth et al, "SYSTEM FOR BINARY DATA TRANSMISSION," U.S. Pat. No. 4,453,249, June 1984 (called Patent document 1).
Shin et al, "METHOD OF CONSTRUCTING QC-LDPC CODES USING QTH-ORDER POWER RESIDUE," US Patent Application Publication, Pub. No. US2005/0149845 A1, July 2005 (called Patent document 2).

SUMMARY

In the linear code, information words are converted to code words on a one-to-one basis given a generator matrix. Whereas the error-correcting performance of an LDPC code is determined by the structure of its parity check matrix, simply giving a parity check matrix still leaves a degree of freedom in converting information words to code words. Where a quasi-cyclic code is used as an LDPC code, a systematic code may be devised in such a manner that the bits specifically positioned in units of $n_0$ bits are used as parity bits. This technique involving a k-stage shift register for encoding contributes to making circuitry simpler than in the case of resorting to matrix operations. Still, there is need for more consideration of the degree of freedom in determining which particularly positioned bits to use as the parity bits arrayed in units of $n_0$ bits.

The present application has been made in view of the above circumstances and provides arrangements such as to reduce the size of encoding circuitry.

According to one embodiment thereof, there is provided an encoding method for encoding by use of a quasi-cyclic code having a code length of $n=m\,n_0$ and an information word length of $k=m\,k_0$, the encoding method including the steps of: creating a systematic code with as many as $(n_0-k_0)$ parity bits inserted therein in units of an information word $k_0$; making all combinations of $(n_0-k_0)$ parity bit positions that may occur in units of $n_0$ bits out of the systematic code; describing a plurality of m×m cyclic matrices by rearranging the sequence of columns in a parity check matrix in all the combinations of the parity bit positions; subjecting the parity check matrix to elementary transformation in such a manner that (n−k)×(n−k) matrices made up of the columns corresponding to the parity bit positions are created as a unit matrix; regarding the matrix having undergone elementary transformation as a first matrix and the first matrix minus the unit matrix as a second matrix; and allocating (n−k) bit positions for the parity bits in such a manner that the number of non-zero elements included in the second matrix is minimized.

According to another embodiment, there is provided an encoding apparatus for encoding by use of a quasi-cyclic code having a code length of $n=m\,n_0$ and an information word length of $k=m\,k_0$, the encoding apparatus including: a section configured to create a systematic code with as many as $(n_0-k_0)$ parity bits inserted therein in units of an information word $k_0$; a section configured to make all combinations of $(n_0-k_0)$ parity bit positions that may occur in units of $n_0$ bits out of the systematic code; a section configured to describe a plurality of m×m cyclic matrices by rearranging the sequence of columns in a parity check matrix in all the combinations of the parity bit positions; a section configured to subject the parity check matrix to elementary transformation in such a manner that (n−k)×(n−k) matrices made up of the columns corresponding to the parity bit positions are created as a unit matrix; a section configured to regard the matrix having undergone elementary transformation as a first matrix and the first matrix minus the unit matrix as a second matrix; and a section configured to allocate (n−k) bit positions for the parity bits in such a manner that the number of non-zero elements included in the second matrix is minimized.

Preferably, the encoding apparatus of the present application may further include a k-stage shift register configured to acquire the allocated parity bits.

Preferably, the encoding apparatus of the present application may further include as many as $k_0$ m-stage shift registers configured to acquire the allocated parity bits.

Preferably, the encoding apparatus of the present application may further include as many as $(n_0-k_0)$ m-stage shift registers configured to acquire the allocated parity bits.

According to a further embodiment, there is provided a program devised as a computer-readable program for controlling encoding by use of a quasi-cyclic code having a code length of $n=m\,n_0$ and an information word length of $k=m\,k_0$, the program causing a computer to execute a procedure including the steps of: creating a systematic code with as many as $(n_0-k_0)$ parity bits inserted therein in units of an information word $k_0$; making all combinations of $(n_0-k_0)$ parity bit positions that may occur in units of $n_0$ bits out of the systematic code; describing a plurality of m×m cyclic matrices by rearranging the sequence of columns in a parity check matrix in all the combinations of the parity bit positions; subjecting the parity check matrix to elementary transformation in such a manner that (n−k)×(n−k) matrices made up of the columns corresponding to the parity bit positions are created as a unit matrix; regarding the matrix having undergone elementary transformation as a first matrix and the first matrix minus the unit matrix as a second matrix; and allocating (n−k) bit positions for the parity bits in such a manner that the number of non-zero elements included in the second matrix is minimized.

Through the use of any one of the encoding method, encoding apparatus, and program outlined above as embodiments, encoding is carried out by use of a quasi-cyclic code having a code length of $n=m\,n_0$ and an information word length of $k=m\,k_0$. A systematic code is first created with as many as $(n_0-k_0)$ parity bits inserted therein in units of an information word $k_0$. All combinations of $(n_0-k_0)$ parity bit positions that may occur in units of $n_0$ bits are made out of the systematic code. A plurality of m×m cyclic matrices are then described by rearranging the sequence of columns in a parity check matrix in all the combinations of the parity bit positions. The parity check matrix is subjected to elementary transformation in such a manner that (n−k)×(n−k) matrices made up of the columns corresponding to the parity bit positions are created as a unit matrix. The matrix having undergone elementary transformation is regarded as a first matrix and the first matrix minus the unit matrix as a second matrix. As many as (n−k) bit positions are then allocated for the parity bits in such a manner that the number of non-zero elements included in the second matrix is minimized.

According to a further embodiment, there is provided an encoding method for encoding by use of a quasi-cyclic code having a code length of $n=m\,n_0$ and an information word length of $k=m\,k_0$, the encoding method including the steps of: creating a systematic code with as many as $(n_0-k_0)$ parity bits inserted therein in units of an information word $k_0$; making all combinations of $(n_0-k_0)$ parity bit positions that may occur in units of $n_0$ bits out of the systematic code; describing a plurality of m×m cyclic matrices by rearranging the sequence of columns in a parity check matrix in all the combinations of the parity bit positions; subjecting the parity check matrix to elementary transformation in such a manner that (n−k)×(n−k) matrices made up of the columns corresponding to the parity bit positions are created as a unit matrix; regarding the matrix having undergone elementary transformation as a first matrix and the first matrix minus the unit matrix as a second matrix; and allocating (n−k) bit positions for the parity bits in such a manner that the maximum number of non-zero elements included in each row of the second matrix is minimized.

According to a still further embodiment, there is provided an encoding apparatus for encoding by use of a quasi-cyclic code having a code length of $n=m\,n_0$ and an information word length of $k=m\,k_0$, the encoding apparatus including: a section configured to create a systematic code with as many as $(n_0-k_0)$ parity bits inserted therein in units of an information word $k_0$; a section configured to make all combinations of $(n_0-k_0)$ parity bit positions that may occur in units of $n_0$ bits out of the systematic code; a section configured to describe a plurality of m×m cyclic matrices by rearranging the sequence of columns in a parity check matrix in all the combinations of the parity bit positions; a section configured to subject the parity check matrix to elementary transformation in such a manner that (n−k)×(n−k) matrices made up of the columns corresponding to the parity bit positions are created as a unit matrix; a section configured to regard the matrix having undergone elementary transformation as a first matrix and the first matrix minus the unit matrix as a second matrix; and a section configured to allocate (n−k) bit positions for the parity bits in such a manner that the maximum number of non-zero elements included in each row of the second matrix is minimized.

Preferably, the above-outlined encoding apparatus of an embodiment may further include a k-stage shift register configured to acquire the allocated parity bits.

Preferably, the above-outlined encoding apparatus of an embodiment may further include as many as $k_0$ m-stage shift registers configured to acquire the allocated parity bits.

According to yet further embodiment, there is provided a program devised as a computer-readable program for controlling encoding by use of a quasi-cyclic code having a code length of $n=m\,n_0$ and an information word length of $k=m\,k_0$, the program causing a computer to execute a procedure including the steps of: creating a systematic code with as many as $(n_0-k_0)$ parity bits inserted therein in units of an information word $k_0$; making all combinations of $(n_0-k_0)$ parity bit positions that may occur in units of $n_0$ bits out of the systematic code; describing a plurality of m×m cyclic matrices by rearranging the sequence of columns in a parity check matrix in all the combinations of the parity bit positions; subjecting the parity check matrix to elementary transformation in such a manner that (n−k)×(n−k) matrices made up of the columns corresponding to the parity bit positions are created as a unit matrix; regarding the matrix having undergone elementary transformation as a first matrix and the first matrix minus the unit matrix as a second matrix; and allocating (n−k) bit positions for the parity bits in such a manner that the maximum number of non-zero elements included in each row of the second matrix is minimized.

Through the use of any one of the encoding method, encoding apparatus, and program outlined above as additional embodiments, encoding is carried out by use of a quasi-cyclic code having a code length of $n=m\,n_0$ and an information word length of $k=m\,k_0$. A systematic code is first created with as many as $(n_0-k_0)$ parity bits inserted therein in units of an information word $k_0$. All combinations of $(n_0-k_0)$ parity bit positions that may occur in units of $n_0$ bits are then made out of the systematic code. A plurality of m×m cyclic matrices are described by rearranging the sequence of columns in a parity check matrix in all the combinations of the parity bit positions. The parity check matrix is subjected to elementary transformation in such a manner that (n−k)×(n−k) matrices made up of the columns corresponding to the parity bit positions are created as a unit matrix. The matrix having undergone elementary transformation is regarded as a first matrix and the first matrix minus the unit matrix as a second matrix. As many as (n−k) bit positions are then allocated for the parity bits in such a manner that the maximum number of non-zero elements included in each row of the second matrix is minimized.

According to another embodiment, there is provided an encoding method for encoding by use of a quasi-cyclic code having a code length of n=m $n_0$ and an information word length of k=m $k_0$, the encoding method including the steps of: creating a systematic code with as many as ($n_0$−$k_0$) parity bits inserted therein in units of an information word $k_0$; making all combinations of ($n_0$−$k_0$) parity bit positions that may occur in units of $n_0$ bits out of the systematic code; describing a plurality of m×m cyclic matrices by rearranging the sequence of columns in a parity check matrix in all the combinations of the parity bit positions; subjecting the parity check matrix to elementary transformation in such a manner that (n−k)×(n−k) matrices made up of the columns corresponding to the parity bit positions are created as a unit matrix; regarding the matrix having undergone elementary transformation as a first matrix and the first matrix minus the unit matrix as a second matrix; and allocating (n−k) bit positions for the parity bits in such a manner that the maximum number of non-zero elements among the $k_0$ elements arrayed in units of m columns per row of the second matrix is minimized.

According to a further embodiment, there is provided an encoding apparatus for encoding by use of a quasi-cyclic code having a code length of n=m $n_0$ and an information word length of k=m $k_0$, the encoding apparatus including: a section configured to create a systematic code with as many as ($n_0$−$k_0$) parity bits inserted therein in units of an information word $k_0$; a section configured to make all combinations of ($n_0$−$k_0$) parity bit positions that may occur in units of $n_0$ bits out of the systematic code; a section configured to describe a plurality of m×m cyclic matrices by rearranging the sequence of columns in a parity check matrix in all the combinations of the parity bit positions; a section configured to subject the parity check matrix to elementary transformation in such a manner that (n−k)×(n−k) matrices made up of the columns corresponding to the parity bit positions are created as a unit matrix; a section configured to regard the matrix having undergone elementary transformation as a first matrix and the first matrix minus the unit matrix as a second matrix; and a section configured to allocate (n−k) bit positions for the parity bits in such a manner that the maximum number of non-zero elements among the $k_0$ elements arrayed in units of m columns per row of the second matrix is minimized.

Preferably, the above-outlined encoding apparatus of an embodiment may further include as many as ($n_0$−$k_0$) m-stage shift registers configured to acquire the allocated parity bits.

According to an embodiment, there is provided a program devised as a computer-readable program for controlling encoding by use of a quasi-cyclic code having a code length of n=m $n_0$ and an information word length of k=m $k_0$, the program causing a computer to execute a procedure including the steps of: creating a systematic code with as many as ($n_0$−$k_0$) parity bits inserted therein in units of an information word $k_0$; making all combinations of ($n_0$−$k_0$) parity bit positions that may occur in units of $n_0$ bits out of the systematic code; describing a plurality of m×m cyclic matrices by rearranging the sequence of columns in a parity check matrix in all the combinations of the parity bit positions; subjecting the parity check matrix to elementary transformation in such a manner that (n−k)×(n−k) matrices made up of the columns corresponding to the parity bit positions are created as a unit matrix; regarding the matrix having undergone elementary transformation as a first matrix and the first matrix minus the unit matrix as a second matrix; and allocating (n−k) bit positions for the parity bits in such a manner that the maximum number of non-zero elements among the $k_0$ elements arrayed in units of m columns per row of the second matrix is minimized.

Through the use of any one of the encoding method, encoding apparatus, and program outlined above as more additional embodiments, encoding is carried out by use of a quasi-cyclic code having a code length of n=m $n_0$ and an information word length of k=m $k_0$. A systematic code is first created with as many as ($n_0$−$k_0$) parity bits inserted therein in units of an information word $k_0$. All combinations of ($n_0$−$k_0$) parity bit positions that may occur in units of $n_0$ bits are then made out of the systematic code. A plurality of m×m cyclic matrices are described by rearranging the sequence of columns in a parity check matrix in all the combinations of the parity bit positions. The parity check matrix is subjected to elementary transformation in such a manner that (n−k)×(n−k) matrices made up of the columns corresponding to the parity bit positions are created as a unit matrix. The matrix having undergone elementary transformation is regarded as a first matrix and the first matrix minus the unit matrix as a second matrix. As many as (n−k) bit positions are then allocated for the parity bits in such a manner that the maximum number of non-zero elements among the $k_0$ elements arrayed in units of m columns per row of the second matrix is minimized.

An advantage of the present application implemented as outlined above is the capability of reducing the amount of operations to be performed by parity operation circuitry. Another advantage of the present application is that the parity operation circuitry can be reduced in size.

Additional features and advantages are described herein, and will be apparent from the following Detailed Description and the figures.

BRIEF DESCRIPTION OF THE FIGURES

FIG. 3 is a schematic view showing a typical parity check matrix;

FIG. 4 is a schematic view explanatory of a Tanner graph;

FIG. 5 is a schematic view showing another typical parity check matrix;

FIG. 6 is a schematic view describing the general representation of the parity check matrix;

FIG. 7 is a schematic view showing another typical parity check matrix;

FIG. 8 is a schematic view showing another typical parity check matrix;

FIGS. 13A and 13B are schematic views explanatory of parity bit allocations;

FIG. 14 is a schematic view showing a modified parity check matrix;

FIG. 15 is a schematic view showing another modified parity check matrix;

FIG. 18 is a schematic view describing the general representation of the modified parity check matrix;

FIG. 21 is a tabular view showing another typical parity check matrix;

FIG. 22 is a tabular view showing another typical parity check matrix;

FIG. 23 is a tabular view listing the numbers characteristic of a typical parity check matrix;

FIG. 24 is a tabular view listing the numbers characteristic of another typical parity check matrix;

FIG. 25 is a flowchart of steps constituting a typical table creating process;

FIG. 26 is a tabular view listing the numbers characteristic of another typical parity check matrix.

DETAILED DESCRIPTION

Figure 1:
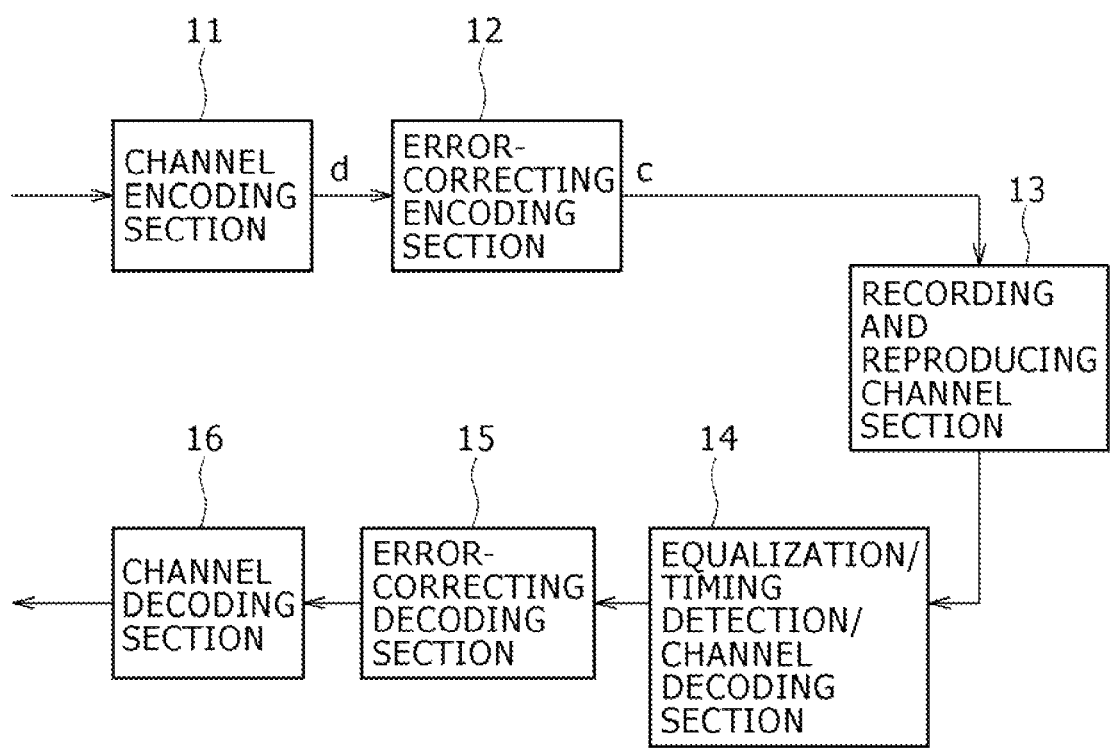
FIG. 1 is a block diagram showing a typical structure of a system according to one embodiment.

Embodiments of the present application will now be described with reference to the accompanying drawings. FIG. 1 is a block diagram showing a typical structure of a recording and reproducing system to which one embodiment of the present application is applied. A channel encoding section 11 converts input data into a limited code adapted to the channel frequency characteristics in effect, the scheme of equalization upon reproduction, and timing detection. The channel code is illustratively a run-length-limited code.

An error-correcting encoding section 12 converts into code words c the information words d that are channel-encoded and given relative redundancy so as to permit correction of errors upon reproduction. The errors could result illustratively from such adverse effects as noise and distortion over the channel in use. The error-correcting encoding section 12 performs encoding in a manner typically based on the Reed-Solomon code or an LDPC (low-density parity-check) code.

A recording and reproducing channel section 13 is constituted illustratively by a write head, magnetic media, and a read head; or by an optical pickup and an optical disk. When used in conjunction with a TV broadcast, the recording and reproducing channel section 13 carries out transmission and reception in a manner compatible with the communication system of the broadcast of interest. Where data is written to and read from a given recording medium, the recording and reproducing channel section 13 is devised to be compatible with the recording medium in question.

An equalization/timing detection/channel decoding section 14 performs equalization and timing detection in a manner suitable for reconstituting record data from reproduced signals while estimating the record data and calculating their probabilities. An error-correcting decoding section 15 corrects errors in reproduced signals by taking advantage of the relative redundancy added thereto upon recording, before outputting the estimates of information words. A channel detecting section 16 reconstitutes data from the error-corrected estimates of information words by reversing the channel encoding process.

During the error-correcting encoding process performed by the error-correcting encoding section 12, it is necessary to minimize any alteration in nature of the channel code constrained by the channel encoding section 11. Where the error-correcting code is devised as a linear block code having a code length n, the code word may be structured as a systematic code made up of k information bits and (n−k) parity bits. Upon encoding, this structure allows the information bits to be used unmodified as part of the code word which need only be supplemented by the parity bits. Upon decoding, the parity bits need only be removed from the code word.

Figure 2A:
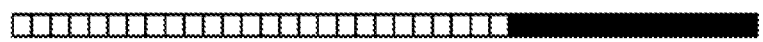
FIGS. 2A and 2B are schematic views explanatory of parity bit allocations.
Figure 2B:

FIGS. 2A and 2B are schematic views showing how information bits and parity bits are typically allocated in a systematic code. In both figures, hollow squares stand for information bits and solid squares for parity bits. FIG. 2A indicates a typical code word of which the first half is filled solely with the information bits and the second half with parity bits alone. FIG. 2B depicts a typical code word in which parity bits are inserted periodically.

If the information bits are collectively allocated apart from the parity bits that are also allocated together as shown in FIG. 2A, the constraint of the channel code is satisfied by the information bits but not by the parity bits. On the other hand, if parity bits are allocated periodically as illustrated in FIG. 2B, the parity bits not satisfying the channel bit constraint are not concentrated locally. This reduces any disturbance that may occur to the channel code constraint. It follows that if the channel encoding section 11 is provided upstream of the error-correcting encoding section 12 in order to perform channel encoding before error-correcting encoding, as in the system of FIG. 1, then parity bits should preferably be inserted periodically into information bits as depicted in FIG. 2B.

The description will be continued below in reference to LDPC (Low Density Parity Check Codes) used as the error-correcting encoding scheme. The LDPC encoding scheme is an error-correcting encoding scheme expressed by a parity check matrix with sparsely distributed non-zero elements therein. Encoding gains approaching the theoretical Shannon limit are known to be attained by performing soft-decision iteration decoding using a Tanner graph corresponding to the parity check matrix in use.

If a given code word is expressed as $c=[c0\ c1\ c2\ldots cn-1]^T$, then a parity check matrix H always meets the relation Hc=0. The matrix H shown in FIG. 3 is a typical parity check matrix of a two-dimensional LDPC code having a code length of n=26 and an information bit count of k=13.

FIG. 4 shows a Tanner graph corresponding to the parity check matrix H. In the typical Tanner graph of FIG. 4, solid black circles stand for variable nodes and hollow squares for check nodes. The variable nodes correspond to the columns of the parity check matrix H and the check nodes to its rows. The lines connecting the check nodes with the variable nodes represent edges that correspond to the non-zero elements of the parity check matrix.

In the decoding of an LDPC code based on stochastic propagation algorithm, the posterior probabilities of the bits corresponding to the variable nodes are updated by repeating the exchanges of numbers representing degrees of reliability between the variable nodes and the check nodes in the Tanner graph. For that reason, each of the nodes should preferably be connected to a plurality of edges. That is, the column weight of the parity check matrix used to decode the LDPC code should preferably be 2 or greater.

For example, the Non-patent document 1 cited earlier shows an example in which the parity check matrix of an LDPC code is regularly structured. The LDPC code proposed in this document is a quasi-cyclic code in nature due to the regular structure of the parity check matrix.

The quasi-cyclic code is a linear code in which a given code word is cyclically shifted $n_0$ times to form another code word. The code length n of the quasi-cyclic code is expressed as $n = m \, n_0$, where m is an integer.

The code expressed by the parity check matrix shown in FIG. 3 is a quasi-cyclic code of which $n_0=2$. FIG. 5 shows a matrix obtained by extracting a column for every $n_0=2$ columns from the parity check matrix of FIG. 3 and rearranging the extracted columns into a plurality of m×m cyclic square matrices. FIG. 6 describes the general representation of the parity check matrix acquired by extracting a column for every $n_0$ columns from the cyclic-code parity check matrix and rearranging the extracted columns as indicated. In FIG. 6, each symbol $H_{i,j}$ stands for an m×m cyclic square matrix.

FIG. 7 shows a parity check matrix having a code length of $n=39$, $n_0=3$, presented as an example in the above-cited Non-patent document 2.

FIG. 8 shows a matrix expressed with three cyclic square matrices obtained by extracting every third column from the parity check matrix in FIG. 7 and rearranging the extracted columns as indicated. In the matrix H' of FIG. 8, the rightmost square matrix (shown enclosed by broken lines) is a 13×13 unit matrix. A generator matrix G' with its parity bits corresponding to the code word positions of these 13 columns is obtained by transposing the remaining columns of the parity check matrix.

More specifically, if H'=[P I], then G'=[I $P^T$].

If a matrix G is obtained by turning the sequence of the columns in the generator matrix G' back into the same sequence as that of the columns in the matrix H, then the encoding of the information word $d=[d_0, d_1, d_2 \ldots d_{k-1}]^T$ into the code word c is expressed as $c=G^T d$.

Figure 9:
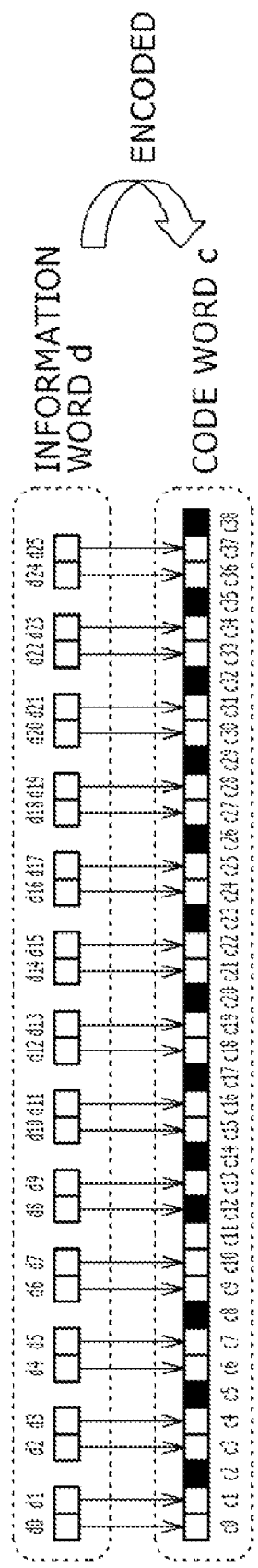
FIG. 9 is a schematic view showing how parity bits are typically inserted.

FIG. 9 schematically shows how the information word d is encoded into the code word c using the generator matrix G obtained as explained above. In the code word, one parity bit $n_0 - k_0 = 1$ is inserted for every two information word bits $k_0 = 2$. This format applies when information words are channel-encoded as shown in FIG. 1 using parity bits.

The above-cited Non-patent document 2 proposes an encoding circuit based on a ($k = m \, k_0$)-stage shift register. Where a matrix is made up of specifically positioned columns extracted from the parity check matrix in units of $n_0$ columns as shown in FIG. 7 and is turned into a unit matrix, the proposed shift register is used for the encoding process whereby the corresponding bit positions are turned into parity bits.

Figure 10:
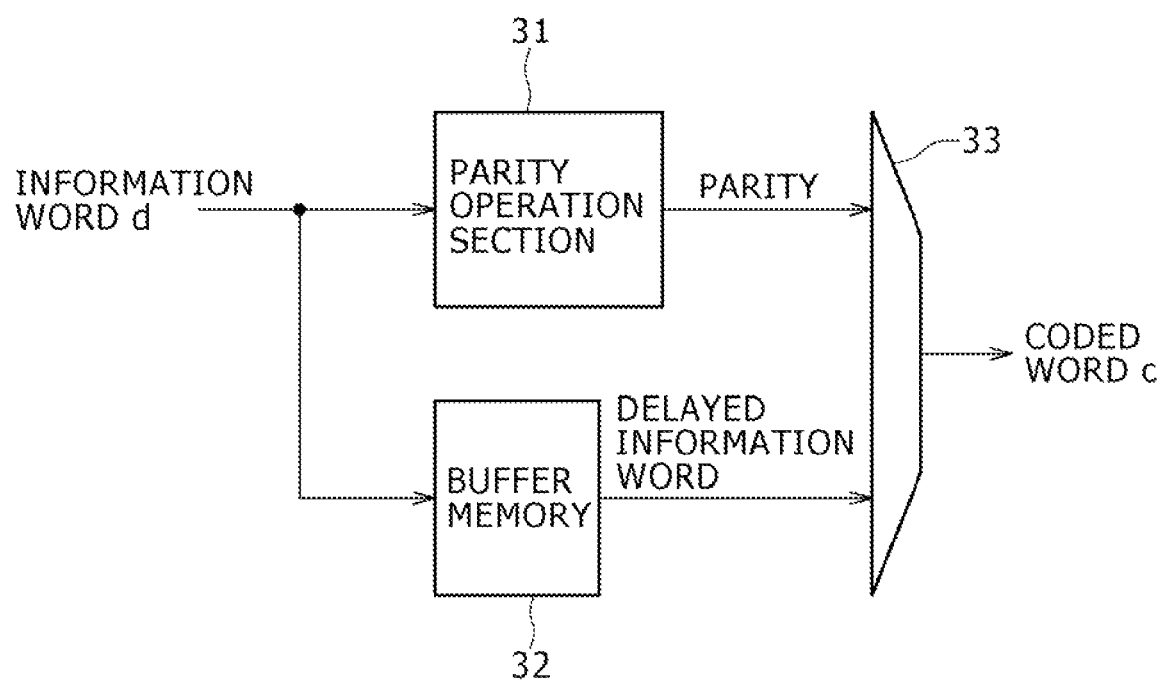
FIG. 10 is a block diagram showing a typical structure of an encoding circuit.

In the case of a systematic code, the error-correcting encoding section 12 may be structured as indicated in FIG. 10. The error-correcting encoding section 12 in FIG. 10 is structured to include a parity operation section 31 that operates on parity bits given the input of an information word d, a buffer memory 32 that delays the information word d, and a selector 33 that rearranges the information word and parity bits into a suitable sequence. Although not shown in FIG. 10, a control section that controls the components of the error-correcting encoding section 12 is also provided.

Figure 11:
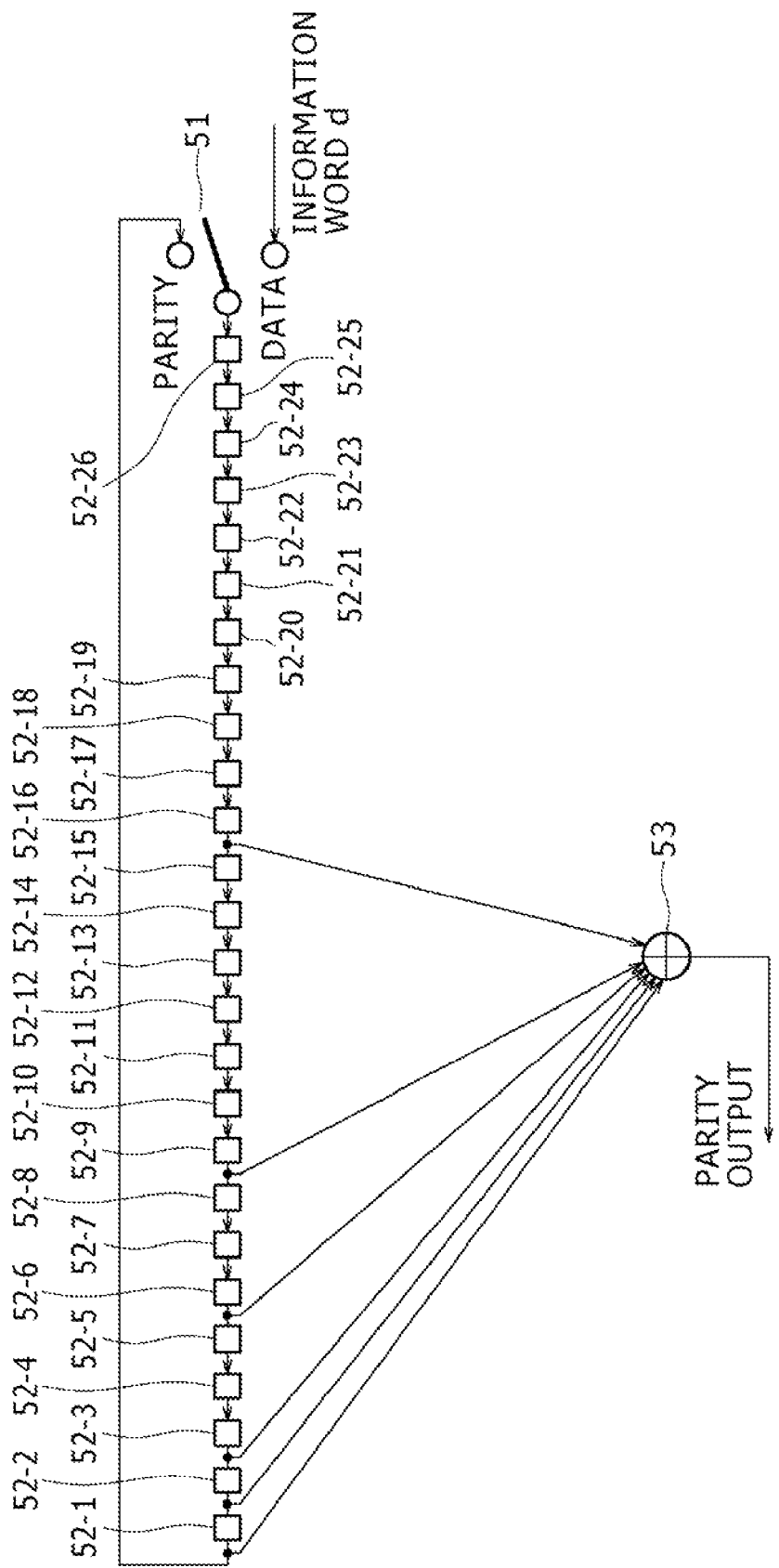
FIG. 11 is a block diagram showing a typical structure of a parity operation circuit.

FIG. 11 is a block diagram of the parity operation circuit 31 including a k-stage shift register for the quasi-cyclic code based on the parity check matrix in FIG. 7. The parity operation circuit 31 is structured to include a switch 51, registers 52-1 through 52-26, and an exclusive-OR (EXOR) circuit 53.

In operation, the switch 51 of the parity operation circuit 31 in FIG. 11 is set to the position for data input, and information words $d_0, d_1, d_2, \ldots, d_{25}$ are held respectively by the registers 52-1 through 52-26. After the input, the switch 51 is positioned to the parity side and the contents in the registers 52-1 through 52-26 are cyclically shifted. First to be output is a parity bit $c_2$ followed by parity bits each getting output every two cycles.

The number and positions of the registers 52-1 through 52-26 connected to the input side of the exclusive-OR circuit 53 are associated illustratively with the "1" positions in the first row of a matrix P. The matrix P is illustratively the matrix in FIG. 8 minus its unit matrix.

Figure 12:
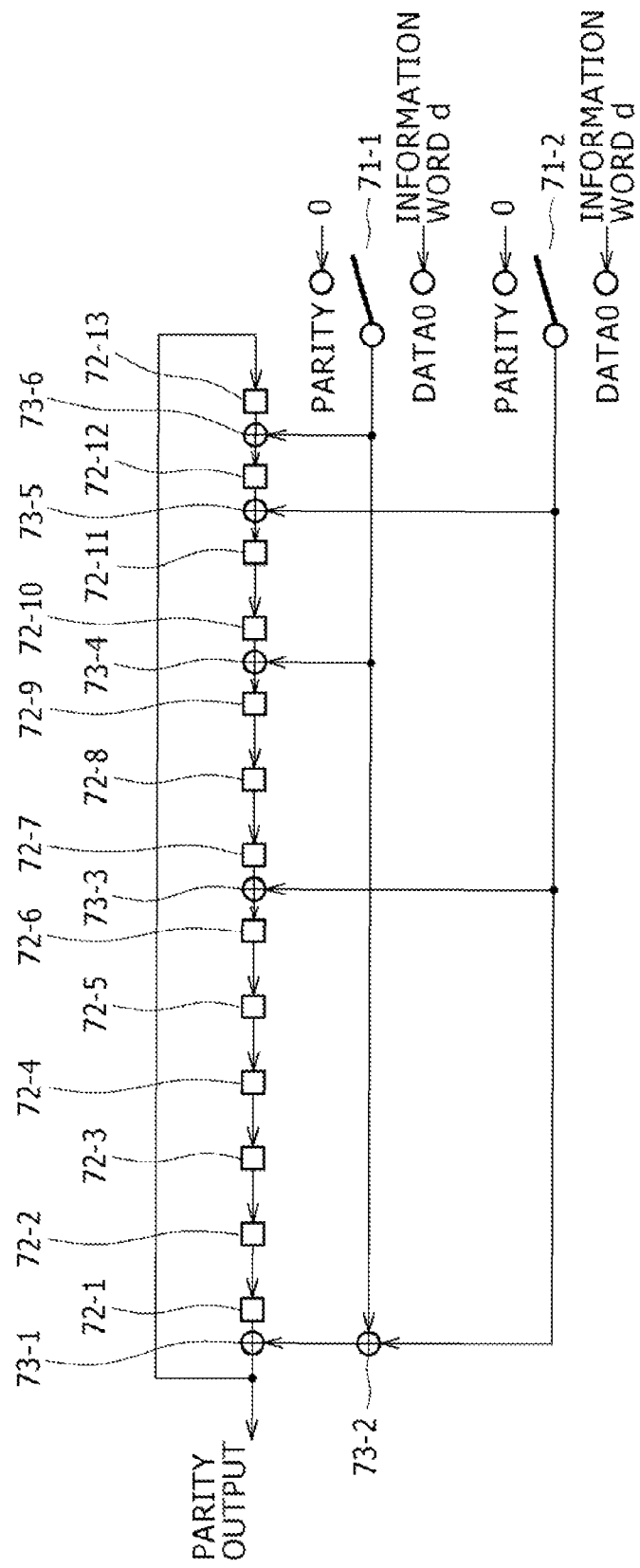
FIG. 12 is a block diagram showing a typical structure of another parity operation circuit.

FIG. 12 is a block diagram of another parity operation circuit 31 including a k/2-stage shift register for the quasi-cyclic code based on the parity check matrix in FIG. 7. This parity operation circuit 31 is structured to include switches 71-1 and 71-2, registers 72-1 through 72-13, and exclusive-OR circuits 73-1 through 73-6.

Prior to encoding, the parity operation circuit 31 of FIG. 12 resets all values in the registers 72-1 through 72-13 to zero. The switches 71-1 and 71-2 are then set to the positions for the input of data 0 and data 1 respectively, and information words $d_0, d_1, d_2, \ldots, d_{25}$ are input two bits at a time. After the input, the registers 72-1 through 72-13 provide parity bits $c_2, c_5, c_8, \ldots, c_{35}$ respectively.

The switches 71-1 and 71-2 are then set to the parity position each, and the contents of the registers 72-1 through 72-13 are cyclically shifted so as to output one parity bit at a time from the leftmost position. The number and positions of the registers 72-1 through 72-13 connected respectively to the input sides of the exclusive-OR circuits 73-1 through 73-6 are associated illustratively with the "1" positions in the first column of each cyclic matrix in the matrix P.

Whereas the LDPC code indicated by the parity check matrix in FIG. 3 is a quasi-cyclic code, the fact that the nodes in the Tanner graph of FIG. 4 are each connected to a plurality of edges signifies that unlike the matrix of FIG. 7, the columns extracted therefrom do not constitute a unit matrix. If the ranks of the matrix made up of (n−k) columns selected from the parity check matrix H match the ranks of the parity check matrix H, then a generator matrix can be obtained illustratively by resorting to Gaussian elimination. However, this kind of matrix modification can complicate the encoding process because the modification changes the nature of the original parity check matrix H being sparsely populated with non-zero elements.

Given a generator matrix, the linear code permits one-to-one conversion from information words to code words. While the error-correcting performance of the LDPC code is determined by the structure of its parity check matrix, simply giving a parity check matrix still leaves a degree of freedom in converting information words to code words. Where a quasi-cyclic code is used as an LDPC code, a systematic code may be devised in such a manner that the bits specifically positioned in units of $n_0$ bits are used as parity bits. In this case, a k-stage shift register may be used for encoding purposes, which contributes to making circuitry simpler than in the case of resorting to matrix operations.

However, there may be given more consideration to the degree of freedom in determining which particularly positioned bits to use as the parity bits arrayed in units of $n_0$ bits. This makes it possible to further reduce the size of encoding circuitry as well as the amount of operations thereby. In the description that follows, the degree of freedom in determining which specifically positioned bits to use as the parity bits arrayed in units of $n_0$ bits will be examined, and specific embodiments for further reducing the size of encoding circuitry and the amount of operations thereby will be explained.

The description will be continued below by citing as an example the LDPC code having the parity check matrix of FIG. 3. Another example to be explained is the case of a systematic code involving the encoding of information words with one parity bit inserted therein per information word bit.

The matrix shown in FIG. 5 is acquired by rearranging the sequence of the columns in the parity check matrix of FIG. 3 and by describing the resulting matrix with two 13×13 cyclic matrices. As illustrated in FIG. 5 and as described above, the LDPC code shown in FIG. 3 is a quasi-cyclic code but the columns extracted therefrom do not make up a unit matrix. In such a case, it is impossible to keep intact the nature of the original parity check matrix H being sparsely populated with non-zero elements. For that reason, encoding could become complicated if the following considerations are not given:

The ranks of the two cyclic matrices in the parity check matrix of FIG. 5 are 13 each. This means that the information bits and parity bits can be allocated in the 26-bit code word using either of the schemes shown in FIGS. 13A and 13B. In FIGS. 13A and 13B, hollow squares stand for information bits and solid squares for parity bits.

A matrix H" shown in FIG. 14 is obtained by subjecting the parity check matrix to elementary transformation such as the bit allocation in FIG. 13A in which each parity bit is followed by an information bit. A matrix H" shown in FIG. 15 is acquired by subjecting the parity check matrix to elementary transformation such as the bit allocation in FIG. 13B in which each information bit is followed by a parity bit.

The left-hand side 13×13 matrix in the matrix H" of FIG. 14 is a unit matrix, and the right-hand side 13×13 matrix in the matrix H" of FIG. 15 is a unit matrix. These cases show that the parity check matrix in FIG. 5 (or in FIG. 3), when subjected to elementary transformation, turns into a matrix including the unit matrix.

Figure 16:
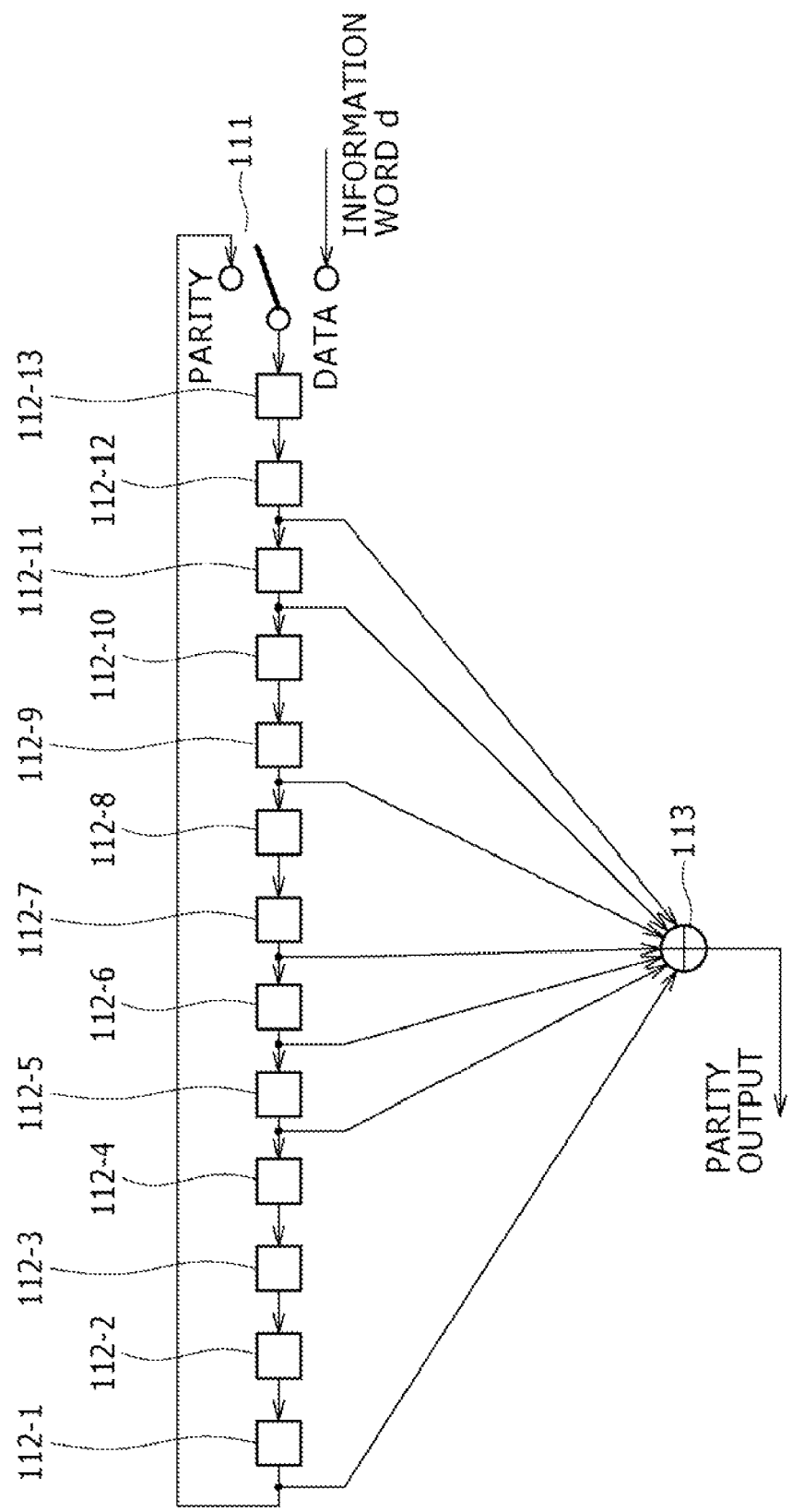
FIG. 16 is a block diagram showing a typical structure of another parity operation circuit.

A parity operation circuit implemented based on the matrix H" in FIG. 14 and using a k-stage shift register is structured as shown in FIG. 16. A parity operation circuit implemented by use of the matrix H" in FIG. 15 and involving a k-stage shift register is structured as shown in FIG. 17.

The parity operation circuit shown in FIG. 16 is structured to include a switch 111, registers 112-1 through 112-13, and an exclusive-OR circuit 113. The exclusive-OR circuit 113 is structured to admit what is output by the registers 112-1, 112-5, 112-6, 112-7, 112-9, 112-11 and 112-12.

Figure 17:
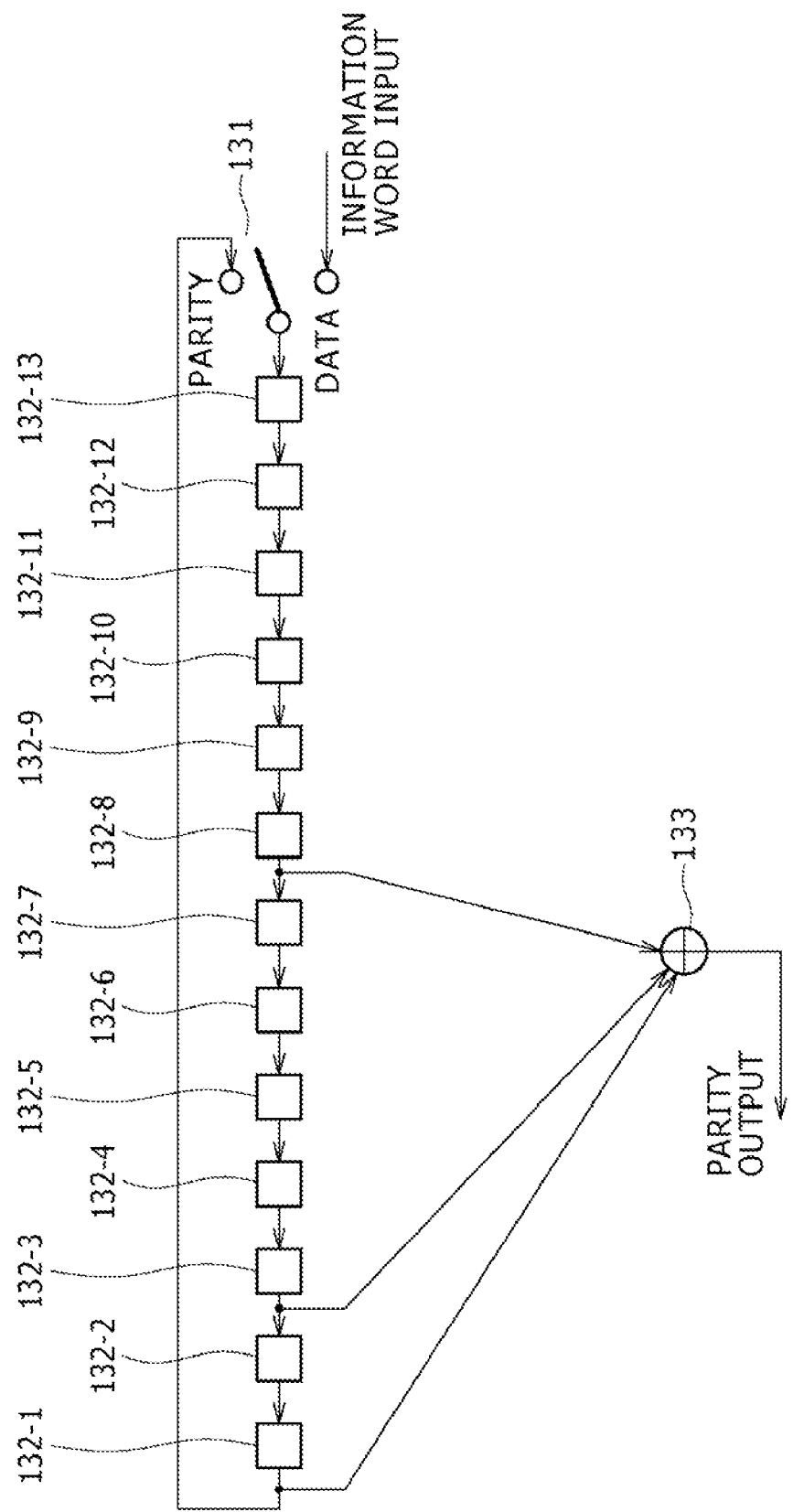
FIG. 17 is a block diagram showing a typical structure of another parity operation circuit.

The parity operation circuit shown in FIG. 17 is structured to include a switch 131, registers 132-1 through 132-13, and an exclusive-OR circuit 133. The exclusive-OR circuit 133 is structured to admit what is output by the registers 132-1, 132-3 and 132-8.

A comparison between the parity operation circuit in FIG. 16 and that in FIG. 17 reveals the following difference: there are seven inputs from the registers 112 to the exclusive-OR circuit 113 in the parity operation circuit of FIG. 16, while there exist three inputs from the registers 132 to the exclusive-OR circuit 133 in the parity operation circuit of FIG. 17.

It can be seen that the fewer data inputs to the exclusive-OR circuit 113 (133) result in a smaller amount of operations performed by that circuit 113 (133). It can also be seen that the fewer data inputs to the exclusive-OR circuit 113 (133) help to make the parity operation circuit smaller in size.

The comparison above between the parity operation circuit in FIG. 16 and that in FIG. 17 has shown that the exclusive-OR circuit 133 in the parity operation circuit of FIG. 17 admits fewer inputs than the exclusive-OR circuit 113 in the parity operation circuit of FIG. 16. That means the parity operation circuit in FIG. 17 is smaller in size and thus operates faster in encoding performance than its counterpart in FIG. 16.

That is, where the LDPC code using the parity check matrix shown FIG. 3 is implemented as a systematic code with one parity bit inserted therein per information word bit, the scheme of allocating information bits and parity bits as shown in FIG. 13B contributes to implementing encoding circuitry that is faster in performance and smaller in size than the bit allocating scheme in FIG. 13A.

The number and positions of the registers 112 (132) connected to the exclusive-OR circuit 113 (133) are associated illustratively with the "1" positions in the first row of the matrix. This aspect of the embodiment will be described below in more detail with reference to FIGS. 14 through 17.

In the parity check matrix H" shown in FIG. 14, the row enclosed by broken lines is associated with the number and positions of the inputs to the exclusive-OR circuit 113 in FIG. 16. More specifically, in the broken line-enclosed row "1000111010110" of the parity check matrix H" in FIG. 14, the "1" positions (non-zero elements) are associated with the number and positions of the inputs to the exclusive-OR circuit 113.

The row "1000111010110" above includes seven non-zero elements representing seven inputs to the exclusive-OR circuit 113. The positions of the non-zero elements in the row represent the positions of the inputs to the exclusive-OR circuit 113, i.e., they indicate from which registers 112 the exclusive-OR circuit 113 receives its inputs. In this example, non-zero elements are found in the first, fifth, sixth, seventh, ninth, eleventh, and twelfth positions from the leftmost position. Thus the registers 112-1, 112-5, 112-6, 112-7, 112-9, 112-11 and 112-12 positioned corresponding to these non-zero elements are connected in such a manner as to have their outputs admitted to the exclusive-OR circuit 113.

The relationship substantially the same as that described above exists between the parity check matrix H" in FIG. 15 and the parity operation circuit shown in FIG. 17. That is, in the parity check matrix H" shown in FIG. 15, the row enclosed by broken lines is associated with the number and positions of the inputs to the exclusive-OR circuit 133 in FIG. 17. More specifically, in the broken line-enclosed row "1010000100000" of the parity check matrix H" in FIG. 15, the "1" positions (non-zero elements) are associated with the number and positions of the inputs to the exclusive-OR circuit 133.

The above row "1010000100000" includes three non-zero elements representing three inputs to the exclusive-OR circuit 133. The positions of the non-zero elements in the row represent the positions of the inputs to the exclusive-OR circuit 133, i.e., they indicate from which registers 132 the exclusive-OR circuit 133 receives its inputs. In this example, non-zero elements are found in the first, second, and eighth positions from the leftmost position. Thus the registers 132-1, 132-2 and 132-8 positioned corresponding to these non-zero elements are connected to have their outputs admitted into the exclusive-OR circuit 133.

In the manner described above, the number and positions of the registers connected to the exclusive-OR circuit are associated with the "1" positions (non-zero element positions) in the first row of the matrix having undergone elementary transformation. The smaller the number of such non-zero elements, the smaller the number of inputs to the exclusive-OR circuit, whereby the amount of operations is lowered and the size of circuitry reduced.

The same principle basically applies to parity operation circuits using the k-stage shift register each. What follows is an explanation of a typical parity operation circuit involving the k-stage shift register.

The parity operation circuit based on the k-shift register needs as many as $n_0-k_0$ exclusive-OR circuits. Illustratively, the number of inputs to an i-th exclusive-OR circuit is given as a non-zero element count w per row in a matrix ($P_{i,0}$ $P_{i,1} \ldots P_{i,k0-1}$) made up of the i-th row of a matrix P having a cyclic matrix $P_{i,j}$ as its elements, as described in FIG. 18.

The larger the number of inputs to exclusive-OR circuits, the longer the time required for them to carry out their operations. Thus selecting the parity bit positions in such a manner as to minimize the largest non-zero element count w provides the fastest possible encoding performance.

The exclusive-OR circuits with as many inputs as the non-zero element count w may also be described in the form of as many as w−1 two-input exclusive-OR circuits. It follows that minimizing the sum w of non-zero elements leads to reducing the size of the encoding circuitry as a whole.

If $k_0$ is 2 or greater, then a separate parity operation circuit using k registers may be devised to carry out all at once the shifts of the parity operation circuit having the k-stage shift register for every $k_0$ clock cycles. This circuit structure involving as many as $k_0$ m-stage shift registers is the same as the structure based on the k-stage shift register in terms of the number of exclusive-OR circuits and the number of inputs to these exclusive-OR circuits. Thus if the parity bit positions are selected in such a manner as to minimize the largest non-zero element count w, then the fastest possible encoding performance can be attained; if the sum w of non-zero elements is minimized, then the encoding circuitry as a whole can be reduced in size.

What follows is a further explanation of the encoding circuit corresponding to the LDPC code which is expressed by the parity check matrix H in FIG. 3 and which has the code length n=24, information bit count k=12, and parity bit count n−k=12.

Figure 19:
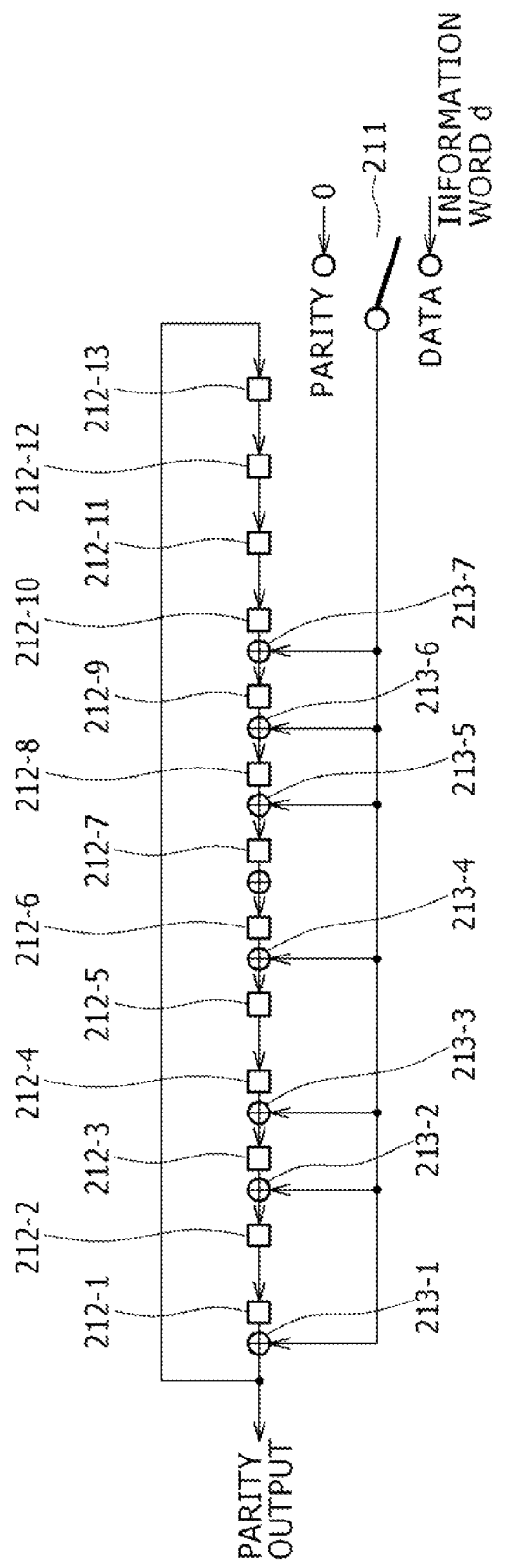
FIG. 19 is a block diagram showing a typical structure of another parity operation circuit.

A parity operation circuit based on as many as $n_0-k_0$ m-stage shift registers corresponding to FIG. 13A is implemented with the structure shown in FIG. 19. A parity operation circuit involving as many as $n_0-k_0$ m-stage shift registers corresponding to FIG. 13B is implemented with the structure shown in FIG. 20.

The parity operation circuit shown in FIG. 19 is structured to include a switch 211, registers 212-1 through 212-13, and exclusive-OR circuits 213-1 through 213-7. The parity operation circuit shown in FIG. 20 is structured to include a switch 231, registers 232-1 through 232-13, and exclusive-OR circuits 233-1 through 233-3.

Figure 20:
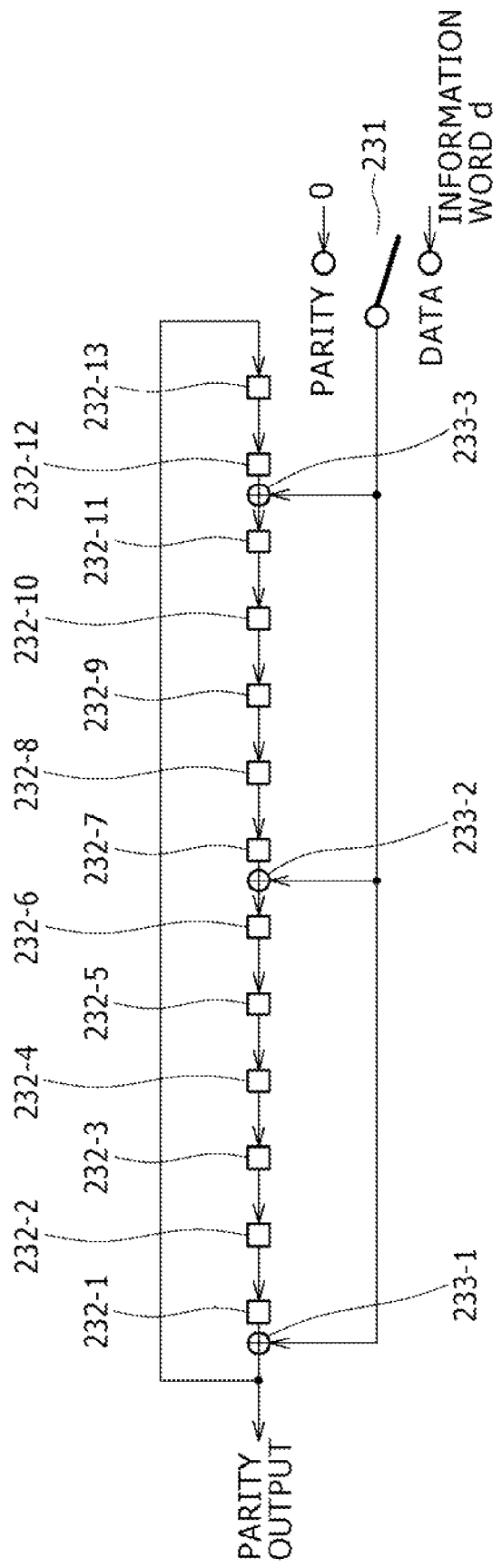
FIG. 20 is a block diagram showing a typical structure of another parity operation circuit.

Comparing the parity operation circuit in FIG. 19 with that in FIG. 20 reveals the following difference: there are seven two-input exclusive-OR circuits 213-1 through 213-7 for parity calculation FIG. 19, while there exist three two-input exclusive-OR circuits 233-1 through 233-3 in FIG. 20. Thus the parity operation circuit in FIG. 20 equipped with the fewer exclusive-OR circuits than the parity operation circuit in FIG. 19 has a smaller circuit size than the latter.

Where an encoding circuit based on as many as ($n_0-k_0$) m-stage shift registers is devised to implement the LDPC code using the parity check matrix H shown FIG. 3 as a systematic code with one parity bit inserted therein per information word bit, the scheme of allocating information bits and parity bits as shown in FIG. 13B contributes to making up encoding circuitry that is smaller in size than the bit allocating scheme in FIG. 13A.

As described above, the number of exclusive-OR circuits needed by the parity operation circuit based on the ($n_0-k_0$) m-stage shift registers is obtained using the matrix P that is acquired by describing the parity check matrix in the form shown in FIG. 18. Those candidate positions in the parity operation circuit into which exclusive-OR circuits are inserted correspond to the outputs of the registers involved. Each of the registers corresponds to each row of the matrix P.

If the components $(P_{i,j})_{r,0}$ of row r, column 0 in each of cyclic matrices $P_{i,0}$, $P_{i,1}$, ..., $P_{i,k0-1}$ are all zero, then the output of the register corresponding to the (mi+r)-th row of the matrix P is connected to the register corresponding to mi+{(r+1)mod m} of the matrix P without passing through any exclusive-OR circuit.

If there is at least one none-zero element (non-zero element count w>0), then as many as w inputs corresponding to the non-zero element positions are exclusive-ORed and the results are connected to the register corresponding to mi+{(r+1)mod m} of the matrix P. If the non-zero element count is greater than zero, then (w+1) inputs are made to the exclusive-OR circuits. Since the time required for operations is longer the larger the number of inputs, the parity bit positions should preferably be selected in such a manner as to minimize the maximum value of the non-zero element count. This arrangement permits faster encoding performance than if the maximum value of the non-zero element count is left being large.

The exclusive-OR circuits with as many as (w+1) inputs can also be described using w two-input exclusive-OR circuits. Thus minimizing the sum of non-zero elements w contributes to reducing the size of the encoding circuitry as a whole.

The examples above were discussed on the assumption that the code word has a relatively small bit count (e.g., 26 bits). For that reason, there is a relatively small difference between the number of data inputs to the exclusive-OR circuits 113 of the parity operation circuit in FIG. 16 on the one hand, and the number of data inputs to the exclusive-OR circuits 133 of the parity operation circuit in FIG. 17 on the other hand (e.g., 3 as opposed to 7). Still, the larger the number of bits to be handled, the greater the difference between the schemes in terms of both the number of inputs to exclusive-OR circuits and the number of the exclusive-OR circuits involved. Described below is an example in which the number of bits to be handled is relatively large.

A typical LDPC code is assumed based on a quasi-cyclic code where $n_0$=18, $k_0$=17 and m=148, the code involving the use of the matrix expressed as $$H'=[H_{0,0}H_{0,1} \ldots H_{0,17}]$$

which is acquired by rearranging the columns extracted every $n_0$ column from the parity check matrix. If this notation is used to represent the parity check matrix H' in FIG. 5, the matrix is expressed as $$H'=[H_{0,0}H_{0,1}]$$

That is, the left-hand side matrix in FIG. 5 is expressed as $H_{0,0}$ and the right-hand side matrix as $H_{0,1}$.

Each component matrix $H_{0,j}$ in the matrix $H'=[H_{0,0}$ $H_{0,1} \ldots H_{0,17}]$ is a 148×148 cyclic square matrix. Since it is difficult actually to illustrate a matrix having as many as eighteen 148×148 cyclic square matrices arrayed therein, the matrix is expressed in tabular form as shown in FIG. 21.

FIG. 21 lists the row numbers of the rows each having non-zero elements in column $n_0$ of each cyclic matrix. For example, 1's are found in rows 111, 136 and 147 of column 0 in the cyclic square matrix $H_{0,0}$; the elements are 0's in the other rows.

For reference, if the parity check matrix H' in FIG. 5 is expressed in the form shown in FIG. 21, the result is as indicated in FIG. 22. Referencing both FIG. 5 and FIG. 22 reveals that column 0 in the left-hand side matrix $H_{0,0}$ of the parity check matrix H' in FIG. 5 has 1's arrayed in rows 0, 9 and 12, as listed in FIG. 22. Likewise, column 0 of the right-hand side matrix $H_{0,1}$ in the parity check matrix H' in FIG. 5 is shown to have 1's arrayed in rows 0, 6 and 11, as listed in FIG. 22.

Back to the explanation of the matrices shown in FIG. 21, the elements in column 0 of each matrix $H_{0,j}$ are 0's except for the rows of which the row numbers are listed in FIG. 21. Each of the columns other than column 0 in each matrix $H_{0,j}$ is obtained by shifting down one stage the column positioned immediately to the left.

The ranks of all cyclic matrices are 148. It follows that there exist 18 possible bit allocations in which one parity bit is inserted for every 18 bits.

The parity operation circuit may be constituted by a k (=2516) stage shift register or by as many as $k_0$ (=17) m (=148) stage shift registers. Described below is an example with the smaller register count, in which the parity operation circuit is implemented using an $n_0-k_0$ (=1) m (=148) stage shift register. This example is explained hereunder because the size of the eventually practiced circuitry is made smaller the fewer the registers involved.

One criterion for determining whether to design a parity operation circuit with a k-stage shift register or a parity operation circuit using as many as $(n_0-k_0)$ m-stage shift registers may well be constituted by the selection of the parity operation circuit having eventually the smaller register count of the two. Which parity operation circuit will eventually contain the fewer registers may be determined illustratively as follows: if the encoding ratio in effect is ½ or smaller, then the parity operation circuit with the k-stage shift register should be designed; if the encoding ratio is ½ or higher, then the parity operation circuit with the $(n_0-k_0)$ m-stage shift registers should be selected.

Where there exist a large number of bits to be dealt with, what was discussed above should preferably be taken into consideration in determining what kind of parity operation circuit to design. Following the determination, a table such as one shown in FIG. 23 may be created with regard to the parity operation circuit thus selected.

The table of FIG. 23 applies to a case where 18 possible allocations of bit positions serving as parity candidates are selected; where the rows of the parity check matrix H' are subjected to elementary transformation so that each parity position candidate is matched with a corresponding cyclic matrix regarded as a unit matrix; and where the remaining matrix minus the columns corresponding to the parity positions is adopted as a matrix P. In that case, the table of FIG. 23 shows the sums w of non-zero elements and the largest numbers of non-zero elements included in the matrix P.

The description will be continued below using again the matrix discussed above by referring to FIG. 5. The matrix shown in FIG. 3 is transformed to the matrix of FIG. 5 before being transformed further into the matrix including the unit matrix shown in FIG. 15 or 16 in correspondence to the parity allocation positions. With a different matrix created for each different parity allocation position, the table of FIG. 23 indicates the characteristics of the matrices shown in FIG. 21.

In the case above, there are 18 parity allocation positions, so that 18 matrices each including the unit matrix shown in FIG. 15 or 16 are created. There exist cyclic matrices $H_{0,0}$, $H_{0,1}$, . . . , $H_{0,17}$ corresponding to the parity positions. The partial matrix P is then created by subtracting the unit matrix from the matrix obtained through elementary transformation of the rows. FIG. 23 thus shows the sums w of non-zero elements and their maximum numbers as part of the matrix P.

For reference, if the matrix H" in FIGS. 14 and 15 derived from the parity check matrix H' in FIG. 5 is expressed in the form shown in FIG. 23, the result is what is indicated in FIG. 24. Referencing both FIG. 14 and FIG. 24 reveals that the number of non-zero elements included in one row across the columns on the right-hand side of the matrix H" in FIG. 14 (i.e., opposite to the unit matrix side) is "7." That means the sum w is "7" and the maximum number of w is "1." Likewise, referencing both FIG. 15 and FIG. 24 reveals that the number of non-zero elements included in one row across the columns on the left-hand side of the matrix H" in FIG. 15 (i.e., opposite to the unit matrix side) is "3." That means the sum w is "3" and the maximum number of w is "1."

FIG. 24 is a table of values that apply when the parity operation circuit with as many as $(n_0-k_0)$ m-stage shift registers is to be created. The matrix H" shown in FIG. 14 or 15 is a matrix in effect when $k_0=1$, so that the largest possible number of w is 1. Hence the maximum number of w being "1" as shown in FIG. 24.

Referring again to the table of FIG. 23, this is a table of values that apply when the parity operation circuit with as many as $(n_0-k_0)$ m-stage shift registers is to be created and when $k_0=17$. Thus the largest possible number of w ranges from 1 to 17. In FIG. 23, the smallest number of w is shown to be "6" and the largest number to be "16." This is a range that falls between 1 and 17.

The sum of w, as described above, represents the total number of data inputs to the exclusive-OR circuits involved, while the largest number of w denotes the maximum number of data inputs to a single exclusive-OR circuit. By selecting the smallest possible sum w and the smallest possible maximum count w, it is possible to reduce the size of the eventual circuitry and lower the amount of operations performed thereby.

In the example of FIG. 23, the sum and the maximum of w are both minimized when the positions corresponding to the matrix $H_{0,4}$ are selected as parity positions. Thus the encoding method for allowing the bit positions corresponding to the matrix $H_{0,4}$ to be allocated as the parity positions is devised using the LDPC code based on the quasi-cyclic code of $n_0=18$, $k_0=17$ and m=148. This is the scheme that makes up the encoding circuit of the smallest size operating at the highest speed.

Referring to the example of FIG. 23, the sum of w in the cyclic matrix $H_{0,0}$ is shown to be "1263" and the sum of w in the cyclic matrix $H_{0,4}$ to be "427." These numbers indicate that the sum in the cyclic matrix $H_{0,0}$ is about three times as large as the sum in the cyclic matrix $H_{0,4}$. It follows that in the above case, the parity operation circuit created by use of the cyclic matrix $H_{0,0}$ makes the total sum of data inputs to each exclusive-OR circuit about three times as large as the parity operation circuit created using the cyclic matrix $H_{0,4}$.

As described above, as the number of bits to be handled becomes progressively larger, the number of data inputs to the exclusive-OR circuits involved comes to vary greatly depending on what kind of cyclic matrix is to be adopted. These variations are believed to result in significant differences in terms of both the size of circuitry and the amount of operations performed thereby. Thus where the number of bits to be dealt with turns out to be large, the size of the circuits involved and the amount of operations executed thereby can be reduced appreciably by practicing the present application. Since the process up to the selection of an appropriate cyclic matrix, i.e., up to the preparation of the table such as one shown in FIG. 23, is relatively simple as explained above, it will not amount to a significant burden on those skilled in the art compared with ordinarily practiced processes.

In the example described above in reference to FIG. 23, the matrix $H_{0,4}$ turned out to have both the smallest sum of w and the smallest maximum number of w. It might happen that the matrix having the smallest sum of w is different from the matrix with the smallest maximum number of w. In such a case, priority may be given to one of the two alternatives in the design stage. That is, a choice can be made between a reduced total number of data inputs to the exclusive-OR circuits involved on the one hand, and a reduced maximum number of data inputs to a single exclusive-OR circuit on the other hand.

As discussed above, the size of circuitry and the amount of operations performed thereby can be reduced by selecting the matrix having the smallest sum of w and/or the smallest maximum number of w and by designing a parity operation circuit that matches the selected matrix. When the table such as one shown in FIG. 23 is prepared, it is possible to predict a specific size of circuitry through the use of a particular cyclic matrix out of the cyclic matrices corresponding to parity candidate positions. It follows that the table prepared as shown in FIG. 23 is meaningful when used as one material for designing a circuit for a particular purpose; there is no need always to select the matrix with the smallest sum of w or with the smallest maximum number of w in designing the circuit.

The above-described process up to the preparation of the table such as one shown in FIG. 23 is summarized below in the form of a flowchart of steps as indicated in FIG. 25. Simplified explanations will be added to the steps constituting the process.

In step S21 of FIG. 25, the parity check matrix targeted for processing is determined. Illustratively, the parity check matrix such as one shown in FIG. 3 is selected as the target matrix to be processed.

In step S22, the target parity check matrix is subjected to elementary transformation. The elementary transformation involves transforming the target parity check matrix into a matrix including unit matrices. By step S22, the parity check matrix such as one shown in FIG. 3 is transformed into the matrix such as one indicated in FIG. 14 or 15. Preparatory to elementary transformation, there may be carried out steps to turn the target matrix into the matrix such as one shown in FIG. 5.

The elementary transformation of the target matrix in step S22 may be accomplished either manually or by execution of a suitably devised program or programs. The same applies to the other steps making up the flowchart of FIG. 25.

In step S23, a check is made to determine whether or not the encoding ratio with regard to the parity operation circuit to be designed is higher than ½. This check, as discussed above, is intended to decide on the scheme ensuring the smallest possible number of registers included in the parity operation circuit. If the encoding ratio is found to be higher than ½, then step S24 is reached.

In step S24, a table of values is made for the parity operation circuit using as many as $(n_0-k_0)$ m-stage shift registers. For example, if the parity check matrix shown in FIG. 3 is the target matrix to be processed, then the table shown in FIG. 24 is prepared in order to create the parity operation circuit of FIG. 19 or 20. If the parity check matrix indicated in FIG. 21 is the target matrix to be dealt with, then the table shown in FIG. 23 is prepared.

If in step S23 the encoding ratio is found to be less than ½, then control is passed on to step S25.

In step S25, a table of values is made for the parity operation circuit involving a k-stage shift register. Illustratively, if the parity check matrix shown in FIG. 3 is the target matrix to be processed, then the table indicated in FIG. 26 is prepared so as to create the parity operation circuit shown in FIG. 16 or 17.

The table shown in FIG. 26 applies when the parity check matrix of FIG. 3 is the target matrix to be processed. This table is used when the parity operation circuit based on the k-stage shift register is to be designed. For that reason, the sums of w in the table of FIG. 26 are the same as those in the table of FIG. 24 but the maximum numbers of w are different from those in the table of FIG. 24. Because $n_0-k_0=1$ in this case, there is only one exclusive-OR circuit included in the parity operation circuit to be designed using the k-stage shift register.

Since the largest number of w represents the largest number of data inputs to one exclusive-OR circuit, if there is only one exclusive-OR circuit to be constituted, then the maximum number of data inputs to that circuit becomes the same as the sum of w representative of the number of data inputs to the exclusive-OR circuits that may be involved. Hence the table prepared as shown FIG. 26.

From the table prepared as described, the cyclic matrix having the smallest sum of w may be selected. The parity operation circuit may then be designed on the basis of the selected cyclic matrix. Alternatively, the cyclic matrix with the smallest maximum number of w may be selected from the table, and the parity operation circuit may be designed using the cyclic matrix thus determined.

According to an embodiment, as discussed above, there may be provided a communication system or a recording and reproducing system using as an LDPC code a quasi-cyclic code having a code length of $n=m\,n_0$ and an information word length of $k=m\,k_0$. The system includes: a section configured to create a systematic code with as many as $(n_0-k_0)$ parity bits inserted therein in units of an information word $k_0$; a section configured to make all combinations of $(n_0-k_0)$ parity bit positions that may occur in units of $n_0$ bits out of the systematic code; a section configured to describe a plurality of m×m cyclic matrices by rearranging the sequence of columns in a parity check matrix in all the combinations of the parity bit positions; a section configured to subject the parity check matrix to elementary transformation in such a manner that (n−k)×(n−k) matrices made up of the columns corresponding to the parity bit positions are created as a unit matrix; a section configured to regard the matrix having undergone elementary transformation as a first matrix and the first matrix minus the unit matrix as a second matrix P; and a section configured to allocate (n−k) bit positions for the parity bits in such a manner that:

(1) the number of non-zero elements included in the matrix P is minimized; and/or (2) the maximum number of non-zero elements per row of the matrix P is minimized; and/or (3) the maximum number of non-zero elements among the $k_0$ elements arrayed in units of m columns per row of the matrix P is minimized. The inventive system thus offers the following major benefits:

As described above, the number of inputs to exclusive-OR circuits is minimized in the parity operation circuit based on the k-stage shift register. This makes it possible to implement a circuit that operates at high speed. It is also possible to reduce the size of the $(n_0-k_0)$ exclusive-OR circuits.

The same effect can be obtained using $k_0$ m-stage shift registers.

As depicted, the number of inputs to exclusive-OR circuits is minimized in the party operation circuit using $(n_0-k_0)$ m-stage registers. That in turn permits implementation of a circuit that functions at high speed. It is also possible to reduce the size of the exclusive-OR circuits.

Although the LDPC code was cited above in conjunction with the embodiments, this is not limitative of this application. Alternatively, the present application may be applied to cases where a code other than the LDPC code is employed.

The series of the steps described above may be executed either by hardware or by software. For the software-based processing to take place, the program or programs constituting the software may be either incorporated beforehand in dedicated hardware of a computer for program execution or installed upon use from a suitable program storage medium into a general-purpose personal computer or like equipment capable of executing diverse functions based on the installed programs.

Figure 27:
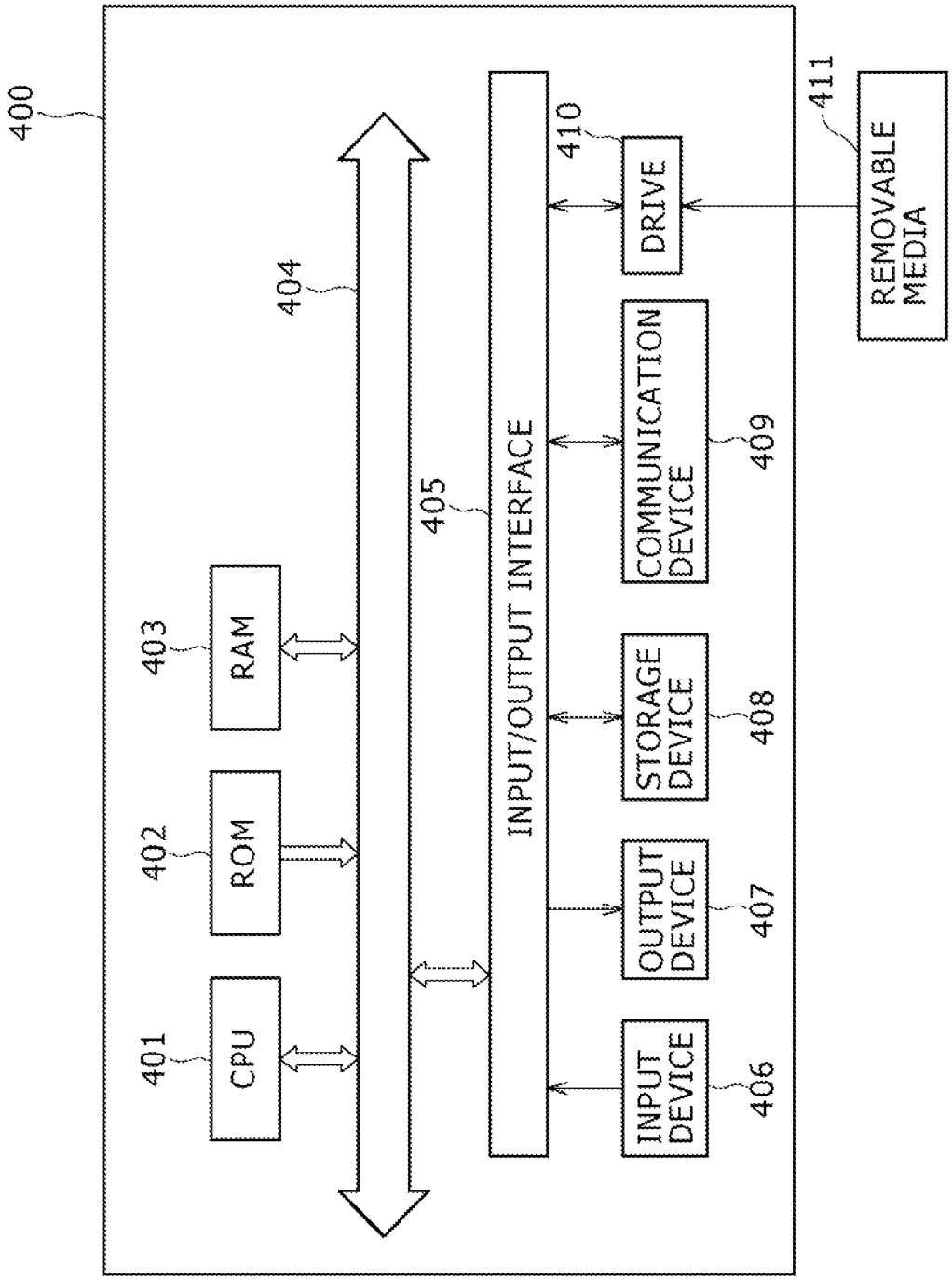
FIG. 27 is a block diagram explanatory of recording media.

FIG. 27 is a block diagram showing a typical hardware structure of a personal computer capable of carrying out the above-described steps by program execution. In this computer, a CPU (central processing unit) 401, a ROM (read only memory) 402, and a RAM (random access memory) 403 are interconnected via a bus 404.

An input/output interface 405 is also connected to the bus 404. The input/output interface 405 is connected with an input device 406, an output device 407, a storage device 408, a communication device 409, and a drive 410. The input device 406 is typically made up of a keyboard, a mouse, and a microphone. The output device 407 is composed typically of a display unit and speakers. The storage device 408 may be constituted by a hard disk drive and/or a nonvolatile memory. The communication device 409 may function as a network interface. The drive 410 may be loaded with and drive any of such removable media 411 as magnetic disks, optical disks, magneto-optical disks, and semiconductor memory.

In the computer of the above-outlined structure, the CPU 401 may illustratively retrieve relevant programs from he storage device 408 and load the retrieved programs into the RAM 403 for execution by way of the input/output interface 405 and bus 404. The above-mentioned steps are then carried out.

The programs to be executed by the computer (i.e., CPU 401) are typically offered to the user as recorded on the removable media 411 serving as package media including magnetic disks (including flexible disks), optical disks (including CD-ROM (Compact Disc read-Only Memory) and DVD (Digital Versatile Disc)), magneto-optical disks, or semiconductor memory. The programs may also be offered to the user via wired or wireless communication media such as local area networks, the Internet, and digital satellite broadcasting networks.

When an appropriate piece of the removable media 411 is loaded into the drive 410, the programs held on the medium may be installed into the storage device 408 through the input/output interface 405. Alternatively, the programs may be received by the communication device 409 over wired or wireless communication media before being installed into the storage device 408. As another alternative, the programs may be preinstalled in the ROM 402 or on the storage device 408.

In this specification, the programs for execution by the computer may be carried out in the depicted sequence (i.e., on a time series basis), in parallel fashion, or individually when they are invoked as needed.

In this specification, the term "system" refers to an entire configuration made up of a plurality of component devices or sections.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An encoding method for encoding by use of a quasi-cyclic code having a code length of $n=m\ n_0$ and an information word length of $k=m\ k_0$, said encoding method comprising:
    creating a systematic code with as many as $(n_0-k_0)$ parity bits inserted therein in units of an information word $k_0$;
    making all combinations of $(n_0-k_0)$ parity bit positions that may occur in units of $n_0$ bits out of said systematic code;
    describing a plurality of m×m cyclic matrices by rearranging the sequence of columns in a parity check matrix in all the combinations of the parity bit positions;
    subjecting said parity check matrix to elementary transformation in such a manner that (n−k)×(n−k) matrices made up of the columns corresponding to the parity bit positions are created as a unit matrix;
    regarding the matrix having undergone elementary transformation as a first matrix and said first matrix minus said unit matrix as a second matrix; and
    allocating (n−k) bit positions for the parity bits in such a manner that the number of non-zero elements included in said second matrix is minimized.

2. An encoding apparatus for encoding by use of a quasi-cyclic code having a code length of $n=m\ n_0$ and an information word length of $k=m\ k_0$, said encoding apparatus comprising:
    a section configured to create a systematic code with as many as $(n_0-k_0)$ parity bits inserted therein in units of an information word $k_0$;
    a section configured to make all combinations of $(n_0-k_0)$ parity bit positions that may occur in units of $n_0$ bits out of said systematic code;
    a section configured to describe a plurality of m×m cyclic matrices by rearranging the sequence of columns in a parity check matrix in all the combinations of the parity bit positions;
    a section configured to subject said parity check matrix to elementary transformation in such a manner that (n−k)×(n−k) matrices made up of the columns corresponding to the parity bit positions are created as a unit matrix;
    a section configured to regard the matrix having undergone elementary transformation as a first matrix and said first matrix minus said unit matrix as a second matrix; and
    a section configured to allocate (n−k) bit positions for the parity bits in such a manner that the number of non-zero elements included in said second matrix is minimized.

3. The encoding apparatus as set forth in claim 2, further comprising a k-stage shift register configured to acquire the allocated parity bits.

4. The encoding apparatus as set forth in claim 2, further comprising as many as $k_0$ m-stage shift registers configured to acquire the allocated parity bits.

5. The encoding apparatus as set forth in claim 2, further comprising as many as $(n_0-k_0)$ m-stage shift registers configured to acquire the allocated parity bits.

6. A program devised as a computer-readable program for controlling encoding by use of a quasi-cyclic code having a code length of $n=m\,n_0$ and an information word length of $k=m\,k_0$, said program causing a computer to execute a procedure comprising the steps of:

creating a systematic code with as many as $(n_0-k_0)$ parity bits inserted therein in units of an information word $k_0$;

making all combinations of $(n_0-k_0)$ parity bit positions that may occur in units of $n_0$ bits out of said systematic code;

describing a plurality of m×m cyclic matrices by rearranging the sequence of columns in a parity check matrix in all the combinations of the parity bit positions;

subjecting said parity check matrix to elementary transformation in such a manner that (n−k)×(n−k) matrices made up of the columns corresponding to the parity bit positions are created as a unit matrix;

regarding the matrix having undergone elementary transformation as a first matrix and said first matrix minus said unit matrix as a second matrix; and allocating (n−k) bit positions for the parity bits in such a manner that the number of non-zero elements included in said second matrix is minimized.

7. An encoding method for encoding by use of a quasi-cyclic code having a code length of $n=m\,n_0$ and an information word length of $k=m\,k_0$, said encoding method comprising:

creating a systematic code with as many as $(n_0-k_0)$ parity bits inserted therein in units of an information word $k_0$;

making all combinations of $(n_0-k_0)$ parity bit positions that may occur in units of $n_0$ bits out of said systematic code;

describing a plurality of m×m cyclic matrices by rearranging the sequence of columns in a parity check matrix in all the combinations of the parity bit positions;

subjecting said parity check matrix to elementary transformation in such a manner that (n−k)×(n−k) matrices made up of the columns corresponding to the parity bit positions are created as a unit matrix;

regarding the matrix having undergone elementary transformation as a first matrix and said first matrix minus said unit matrix as a second matrix; and allocating (n−k) bit positions for the parity bits in such a manner that the maximum number of non-zero elements included in each row of said second matrix is minimized.

8. An encoding apparatus for encoding by use of a quasi-cyclic code having a code length of $n=m\,n_0$ and an information word length of $k=m\,k_0$, said encoding apparatus comprising:

a section configured to create a systematic code with as many as $(n_0-k_0)$ parity bits inserted therein in units of an information word $k_0$;

a section configured to make all combinations of $(n_0-k_0)$ parity bit positions that may occur in units of $n_0$ bits out of said systematic code;

a section configured to describe a plurality of m×m cyclic matrices by rearranging the sequence of columns in a parity check matrix in all the combinations of the parity bit positions;

a section configured to subject said parity check matrix to elementary transformation in such a manner that (n−k)×(n−k) matrices made up of the columns corresponding to the parity bit positions are created as a unit matrix;

a section configured to regard the matrix having undergone elementary transformation as a first matrix and said first matrix minus said unit matrix as a second matrix; and a section configured to allocate (n−k) bit positions for the parity bits in such a manner that the maximum number of non-zero elements included in each row of said second matrix is minimized.

9. The encoding apparatus as set forth in claim 8, further comprising a k-stage shift register configured to acquire the allocated parity bits.

10. The encoding apparatus as set forth in claim 8, further comprising as many as $k_0$ m-stage shift registers configured to acquire the allocated parity bits.

11. A program devised as a computer-readable program for controlling encoding by use of a quasi-cyclic code having a code length of $n=m\,n_0$ and an information word length of $k=m\,k_0$, said program causing a computer to execute a procedure comprising:

creating a systematic code with as many as $(n_0-k_0)$ parity bits inserted therein in units of an information word $k_0$;

making all combinations of $(n_0-k_0)$ parity bit positions that may occur in units of $n_0$ bits out of said systematic code;

describing a plurality of m×m cyclic matrices by rearranging the sequence of columns in a parity check matrix in all the combinations of the parity bit positions;

subjecting said parity check matrix to elementary transformation in such a manner that (n−k)×(n−k) matrices made up of the columns corresponding to the parity bit positions are created as a unit matrix;

regarding the matrix having undergone elementary transformation as a first matrix and said first matrix minus said unit matrix as a second matrix; and allocating (n−k) bit positions for the parity bits in such a manner that the maximum number of non-zero elements included in each row of said second matrix is minimized.

12. An encoding method for encoding by use of a quasi-cyclic code having a code length of $n=m\,n_0$ and an information word length of $k=m\,k_0$, said encoding method comprising:

creating a systematic code with as many as $(n_0-k_0)$ parity bits inserted therein in units of an information word $k_0$;

making all combinations of $(n_0-k_0)$ parity bit positions that may occur in units of $n_0$ bits out of said systematic code;

describing a plurality of m×m cyclic matrices by rearranging the sequence of columns in a parity check matrix in all the combinations of the parity bit positions;

subjecting said parity check matrix to elementary transformation in such a manner that (n−k)×(n−k) matrices made up of the columns corresponding to the parity bit positions are created as a unit matrix;

regarding the matrix having undergone elementary transformation as a first matrix and said first matrix minus said unit matrix as a second matrix; and allocating (n−k) bit positions for the parity bits in such a manner that the maximum number of non-zero elements among the $k_0$ elements arrayed in units of m columns per row of said second matrix is minimized.

13. An encoding apparatus for encoding by use of a quasi-cyclic code having a code length of $n=m\,n_0$ and an information word length of $k=m\,k_0$, said encoding apparatus comprising:

a section configured to create a systematic code with as many as $(n_0-k_0)$ parity bits inserted therein in units of an information word $k_0$;

a section configured to make all combinations of $(n_0-k_0)$ parity bit positions that may occur in units of $n_0$ bits out of said systematic code;

a section configured to describe a plurality of m×m cyclic matrices by rearranging the sequence of columns in a parity check matrix in all the combinations of the parity bit positions;

a section configured to subject said parity check matrix to elementary transformation in such a manner that (n−k)×

(n−k) matrices made up of the columns corresponding to the parity bit positions are created as a unit matrix;

a section configured to regard the matrix having undergone elementary transformation as a first matrix and said first matrix minus said unit matrix as a second matrix; and a section configured to allocate (n−k) bit positions for the parity bits in such a manner that the maximum number of non-zero elements among the $k_0$ elements arrayed in units of m columns per row of said second matrix is minimized.

14. The encoding apparatus as set forth in claim 13, further comprising as many as $(n_0-k_0)$ m-stage shift registers configured to acquire the allocated parity bits.

15. A program devised as a computer-readable program for controlling encoding by use of a quasi-cyclic code having a code length of n=m $n_0$ and an information word length of k=m $k_0$, said program causing a computer to execute a procedure comprising the steps of:

creating a systematic code with as many as $(n_0-k_0)$ parity bits inserted therein in units of an information word $k_0$;

making all combinations of $(n_0-k_0)$ parity bit positions that may occur in units of $n_0$ bits out of said systematic code;

describing a plurality of m×m cyclic matrices by rearranging the sequence of columns in a parity check matrix in all the combinations of the parity bit positions;

subjecting said parity check matrix to elementary transformation in such a manner that (n−k)×(n−k) matrices made up of the columns corresponding to the parity bit positions are created as a unit matrix;

regarding the matrix having undergone elementary transformation as a first matrix and said first matrix minus said unit matrix as a second matrix; and allocating (n−k) bit positions for the parity bits in such a manner that the maximum number of non-zero elements among the $k_0$ elements arrayed in units of m columns per row of said second matrix is minimized.

\* \* \* \* \*